US012469836B2

United States Patent
Tong et al.

(10) Patent No.: US 12,469,836 B2
(45) Date of Patent: Nov. 11, 2025

(54) HIGH BANDWIDTH MEMORY STACK WITH SIDE EDGE INTERCONNECTION AND 3D IC STRUCTURE WITH THE SAME

(71) Applicants: ND-HI TECHNOLOGIES LAB, INC., Taipei (TW); ETRON TECHNOLOGY, INC., Hsinchu (TW)

(72) Inventors: Ho-Ming Tong, Taipei (TW); Chao-Chun Lu, Hsinchu (TW)

(73) Assignees: ND-HI TECHNOLOGIES LAB, INC.; ETRON TECHNOLOGY, INC., Hsinchu (TW)

( * ) Notice: Subject to any disclaimer, the term of this patent is extended or adjusted under 35 U.S.C. 154(b) by 0 days.

(21) Appl. No.: 19/062,467

(22) Filed: Feb. 25, 2025

(65) Prior Publication Data

US 2025/0219042 A1    Jul. 3, 2025

Related U.S. Application Data

(63) Continuation-in-part of application No. 18/471,670, filed on Sep. 21, 2023.
(Continued)

(51) Int. Cl.
*H01L 25/18*    (2023.01)
*H01L 23/00*    (2006.01)
(Continued)

(52) U.S. Cl.
CPC .......... *H01L 25/18* (2013.01); *H01L 23/3738* (2013.01); *H01L 23/538* (2013.01);
(Continued)

(58) Field of Classification Search
CPC ........ H10B 80/00; H10D 80/30; H01L 25/18; H01L 25/0655; H01L 23/3738;
(Continued)

(56) References Cited

U.S. PATENT DOCUMENTS 5,031,072 A    7/1991   Malhi et al.
5,397,747 A    3/1995   Angiulli et al.
(Continued)

FOREIGN PATENT DOCUMENTS

JP    S59194460 A    11/1984
JP    2016004896 A    1/2016

OTHER PUBLICATIONS

Office Action issued by TIPO dated Apr. 21, 2025 for TW112136128.
(Continued)

*Primary Examiner* — Jasmine J Clark
(74) *Attorney, Agent, or Firm* — WPAT, P.C.; Anthony King

(57) ABSTRACT

An IC structure includes a memory stack including semiconductor dies horizontally separate with each other, wherein each semiconductor die has a top surface, a bottom surface, four sidewalls, and a plurality of edge pads arranged along a sidewall. The IC structure further includes a memory controller under the first memory stack and electrically connected to the edge pads of each semiconductor die, a processor circuit disposed over and electrically connected to the memory controller, and a packaging substrate under and electrically connected to the memory controller. A die area of the memory controller is larger than the sum of a horizontal cross-section area of the memory stack and a die area of the processor circuit. There is no interposer between the packaging substrate and the memory controller, and there is no TSV in each semiconductor die.

18 Claims, 17 Drawing Sheets

Related U.S. Application Data

(60) Provisional application No. 63/733,458, filed on Dec. 13, 2024, provisional application No. 63/409,852, filed on Sep. 26, 2022.

(51) Int. Cl.
*H01L 23/373* (2006.01)
*H01L 23/538* (2006.01)
*H01L 25/065* (2023.01)
*H10B 80/00* (2023.01)
*H10D 80/30* (2025.01)

(52) U.S. Cl.
CPC ............. *H01L 24/02* (2013.01); *H01L 24/05* (2013.01); *H01L 24/29* (2013.01); *H01L 24/32* (2013.01); *H01L 25/0655* (2013.01); *H10B 80/00* (2023.02); *H10D 80/30* (2025.01); *H01L 24/16* (2013.01); *H01L 2224/02331* (2013.01); *H01L 2224/05569* (2013.01); *H01L 2224/16146* (2013.01); *H01L 2224/16225* (2013.01); *H01L 2224/29147* (2013.01); *H01L 2224/29184* (2013.01); *H01L 2224/29186* (2013.01); *H01L 2224/32137* (2013.01); *H01L 2224/32145* (2013.01); *H01L 2924/1431* (2013.01); *H01L 2924/1436* (2013.01); *H01L 2924/1437* (2013.01)

(58) Field of Classification Search
CPC ....... H01L 23/538; H01L 24/02; H01L 24/05; H01L 24/29; H01L 24/32
USPC .................................................. 257/712, 777
See application file for complete search history.

(56) References Cited

U.S. PATENT DOCUMENTS

| | | |
|---|---|---|
| 5,561,622 A | 10/1996 | Bertin et al. |
| 6,381,164 B1 | 4/2002 | Fan et al. |
| 8,618,659 B2 | 12/2013 | Sato |
| 9,263,157 B2 | 2/2016 | Kilmer et al. |
| 9,490,195 B1 | 11/2016 | Prabhu |
| 9,865,310 B2 | 1/2018 | Cantle et al. |
| 10,283,492 B2 | 5/2019 | Gamini |
| 10,665,571 B2 | 5/2020 | Lee |
| 11,024,603 B2 | 6/2021 | Chen |
| 11,145,526 B2 | 10/2021 | Wang |
| 11,233,034 B2 | 1/2022 | Keeth |
| 11,239,169 B1 * | 2/2022 | Kirby ................. H01L 25/0657 |
| 11,270,921 B2 | 3/2022 | Hou |
| 11,373,977 B1 | 6/2022 | Bean |
| 11,482,500 B2 | 10/2022 | Bowers |
| 11,526,302 B2 | 12/2022 | Smolka et al. |
| 11,552,054 B2 | 1/2023 | Lin |
| 11,557,541 B2 | 1/2023 | Hossain |
| 11,854,921 B2 | 12/2023 | Yu |
| 11,869,821 B2 | 1/2024 | Ko |
| 11,876,076 B2 | 1/2024 | DeLaCruz et al. |
| 12,027,473 B2 | 7/2024 | Kwon et al. |
| 12,230,613 B2 | 2/2025 | Chang |
| 2007/0102801 A1 | 5/2007 | Ishida |
| 2008/0029884 A1 | 2/2008 | Grafe |
| 2008/0083976 A1 | 4/2008 | Haba |
| 2008/0290493 A1 | 11/2008 | Tsunozaki |
| 2009/0045524 A1 | 2/2009 | Mohammed |
| 2010/0200959 A1 | 8/2010 | Sasaki et al. |
| 2010/0327461 A1 | 12/2010 | Co |
| 2012/0049376 A1 | 3/2012 | Harada |
| 2012/0211878 A1 | 8/2012 | Popovic |
| 2012/0273961 A1 | 11/2012 | Kwon et al. |
| 2013/0099393 A1 | 4/2013 | Jeong |
| 2013/0299977 A1 | 11/2013 | Dayringer |
| 2014/0210097 A1 | 7/2014 | Chen et al. |
| 2014/0264945 A1 | 9/2014 | Yap |
| 2014/0376323 A1 | 12/2014 | Terada |
| 2015/0091179 A1 | 4/2015 | Shenoy |
| 2017/0018485 A1 | 1/2017 | Prabhu |
| 2017/0018529 A1 | 1/2017 | Katkar |
| 2017/0141063 A1 | 5/2017 | Lee |
| 2017/0278833 A1 | 9/2017 | Park |
| 2017/0338203 A1 | 11/2017 | Yuan |
| 2018/0040587 A1 | 2/2018 | Tao |
| 2018/0047706 A1 | 2/2018 | Upadhyayula |
| 2018/0233452 A1 | 8/2018 | Lin |
| 2020/0006246 A1 | 1/2020 | Kong et al. |
| 2020/0006367 A1 | 1/2020 | Krutzik et al. |
| 2022/0328374 A1 | 10/2022 | Zhang |
| 2023/0029098 A1 | 1/2023 | Kim |
| 2023/0042063 A1 | 2/2023 | Bae |
| 2023/0069969 A1 | 3/2023 | Boutaleb |
| 2023/0238300 A1 | 7/2023 | Zhou |
| 2023/0343769 A1 | 10/2023 | Karhade et al. |
| 2023/0369289 A1 | 11/2023 | Guo et al. |
| 2024/0038724 A1 | 2/2024 | Karikalan |
| 2024/0063120 A1 | 2/2024 | Elsherbini et al. |
| 2024/0063179 A1 | 2/2024 | Elsherbini et al. |
| 2024/0099030 A1 | 3/2024 | Huang |
| 2024/0128208 A1 | 4/2024 | Tong |
| 2025/0140741 A1 | 5/2025 | Mongia et al. |

OTHER PUBLICATIONS

English translation of the Search Report appended to Office Action issued by TIPO dated Apr. 21, 2025 for TW112136128.
Office Action of U.S. Appl. No. 19/062,566 issued by USPTO on May 2, 2025.
English abstract of JP2016004896A.
Anthony Agnesina et al., A COTS-Based Novel 3-D DRAM Memory Cube Architecture for Space Applications, IEEE Transactions on Very Large Scale Integration (VLSI) Systems, Sep. 2020, vol. 28 No. 9.
Office Action of U.S. Appl. No. 19/059,275 with search report issued Aug. 12, 2025.
Extended European Search Report with search report issued by the European Patent Office for European Patent Application No. 25159330.7 on Sep. 24, 2025 (8 pages).

* cited by examiner

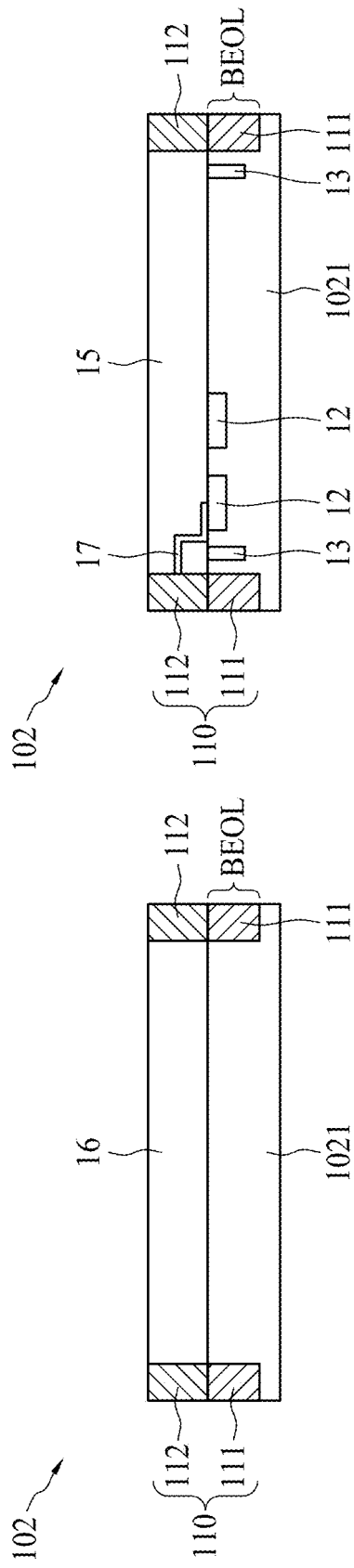

HIGH BANDWIDTH MEMORY STACK WITH SIDE EDGE INTERCONNECTION AND 3D IC STRUCTURE WITH THE SAME

PRIORITY CLAIM AND CROSS-REFERENCE

This application claims the benefit of U.S. provisional application No. 63/733,458 filed Dec. 13, 2024, and is a continuation-in-part application of U.S. non-provisional application Ser. No. 18/471,670 filed Sep. 21, 2023, which claims the benefit of U.S. provisional applications No. 63/409,852 filed Sep. 26, 2022, the disclosures of all of which are incorporated by reference herein in their entirety.

FIELD

This disclosure relates in general to a memory stack within IC structure, and more particularly to a high bandwidth memory stack with side edge interconnections and 3D IC structure including the same.

BACKGROUND 2.5D/3D ICs have been recognized as a next generation semiconductor technology, which has the advantage of high performance, low power consumption, small physical size and high integration density. 2.5D/3D ICs provide a path to continue to meet the performance/cost demands of next generation devices while remaining at more relaxed gate lengths with less process complexity. Thus, 2.5D/3D ICs are expected to find broad based utilities in applications such as HPC (high-performance computing) and data centers, AI (artificial intelligence)/ML (machine learning), 5G/6G networks, graphics, smart phones/wearables, automotive and others that demand "extreme," ultra-high-performance, higher-power-efficiency devices.

Commercial 2.5D/3D ICs such as a 3D high-bandwidth memory (HBM) DRAM memory die stack on logic are increasingly being used, and those HBM devices contain through silicon vias (TSVs) in both active dies and in the silicon interposer. Furthermore, 2.5D/3D ICs also allow for vertical stacking of heterogeneous dies from different manufacturing processes and nodes, chip reuse and chiplets-in-SiP (system-in-a-package) for high-performance applications, which have been already pushing the limits of a single die at the most advanced node. As shown in FIG. 1, a COWOS (chips-on-wafer-on-substrate) structure 20 includes an HBM structure 21 (with a plurality of DRAM memory dies 211 and a controller 212) with TSVs 201, a logic die 22 (such as a GPU or an SOC chip), a silicon interposer 23 with TSVs and a packaging substrate 24, wherein the HBM structure 21 and the logic die 22 are stacked on the silicon interposer 23, and the silicon interposer 23 is then stacked on the packaging substrate 24.

However, 2.5D/3D ICs adopt packaging topologies with bottom/top electrical interconnects created by the aforementioned interconnect technologies such as micro-bumps, TSVs and redistribution layers (RDL). The bottom/top electrical interconnects impose a severe constraint on PPAC (power, performance, area and cost) optimization by designers of 3D ICs to come up with optimal design solutions, especially the difficulty of forming TSVs in semiconductor dies and the alignment of TSVs for each semiconductor die.

Furthermore, as the monolithic integration capability of a silicon chip has grown from GSI (Giga Scale Integration: Over billions of transistors on a die) toward TSI (Tera Scale Integration: Trillions of transistors on a die) soon, the power consumption of running such a huge number of transistors is increasing sharply, which elevates adversely the junction temperature of transistors and thus the entire chip temperature due to current limited heat-dissipation capability (e.g. Thermal conductivity index of silicon dioxide/silicon is very low. To be worse, due to the stack of multiple DRAM memory semiconductor dies (or HBM) in 2.5D/3D ICs, the insufficient heat dissipation problem causing higher temperature to chip operation is regarded as the worst problem for the HBM structure.

SUMMARY

According to a first aspect of the present disclosure, an IC structure includes a first memory stack, wherein the first memory stack includes a plurality of semiconductor dies horizontally separate with each other, wherein each semiconductor die has a top surface, a bottom surface opposite to the top surface, and four sidewalls with a first sidewall, a second sidewall, a third sidewall and a fourth sidewall, and a plurality of edge pads arranged along the first sidewall. The area of the bottom surface or the top surface of each semiconductor die is larger than that of any sidewall. The IC structure further includes a logic die with memory controller under the first memory stack and electrically connected to the plurality of edge pads of each semiconductor die, a logic die with processor circuit disposed over and electrically connected to the logic die with memory controller, and a packaging substrate under and electrically connected to the logic die with memory controller. A die area of the logic die with memory controller is larger than the sum of a horizontal cross-section area of the first memory stack and a die area of the logic die with processor circuit. There is no interposer between the packaging substrate and the logic die with memory controller, and there is no TSV in each semiconductor die.

According to some embodiments of the present disclosure, the IC structure further includes an upward extending thermal conductivity layer and/or a laterally extending thermal conductivity layer. The upward extending thermal conductivity layer is disposed between two adjacent semiconductor dies. The thermal conductivity of the upward extending thermal conductivity layer is higher than that of Si or SiO2. The laterally extending thermal conductivity layer covers each second sidewall of the plurality of semiconductor dies and is thermally coupled to the upward extending thermal conductivity layer, wherein the laterally extending thermal conductivity layer is opposite to the first sidewalls of the plurality of semiconductor dies, and the thermal conductivity of the laterally extending thermal conductivity layer is higher than that of Si or $SiO_2$.

According to some embodiments of the present disclosure, the upward extending thermal conductivity layer or the laterally extending thermal conductivity layer includes undoped polysilicon, large crystalline silicon, SiC, BN, AlN, W, or copper.

According to some embodiments of the present disclosure, each semiconductor die includes a DRAM die or memory die, and the plurality of edge pads of each DRAM die includes about 128 to 5000 edge pads, and a pitch between two adjacent edge pads is between about 5 μm and about 100 μm.

According to some embodiments of the present disclosure, the plurality of edge pads of each semiconductor die includes a subset of data pads, and the logic die with memory controller selects a predetermined data width from the subset of data pads of one semiconductor die, or a portion of the plurality of semiconductor dies, or all the plurality of semiconductor dies.

According to some embodiments of the present disclosure, the predetermined data width selected by the logic die with memory controller is set by a mode register in each semiconductor die.

According to some embodiments of the present disclosure, the logic die with memory controller selects the predetermined data width from the subset of data pads of a portion or all of the plurality of semiconductor dies by a cross-bar circuit.

According to some embodiments of the present disclosure, the logic die with memory controller selects the predetermined data width from the subset of data pads of one, a portion or all of the plurality of semiconductor dies by a plurality of SRAM array respectively corresponding to the plurality of semiconductor dies, wherein each SRAM array temporarily holds the predetermined data width from the corresponding semiconductor die.

According to some embodiments of the present disclosure, the logic die with memory controller includes multiple TSVs.

According to some embodiments of the present disclosure, the IC structure further includes a heat sink over the logic die with processor circuit, and a top surface of the heat sink is level with that of the first memory stack.

According to some embodiments of the present disclosure, the IC structure further includes a second memory stack. The second memory stack includes a plurality of semiconductor dies and an upward extending thermal conductivity layer. The plurality of semiconductor dies horizontally separate with each other, wherein each semiconductor die comprises a top surface, a bottom surface opposite to the top surface, and four sidewalls with a first sidewall, a second sidewall, a third sidewall and a fourth sidewall, and a plurality of edge pads arranged along the first sidewall, wherein the area of the bottom surface or the top surface of each semiconductor die of the second memory stack is larger than that of any sidewall. The upward extending thermal conductivity layer between two adjacent semiconductor dies; wherein the thermal conductivity of the upward extending thermal conductivity layer is higher than that of Si or SiO2, wherein the first memory stack and the second memory stack are horizontally spaced apart from the logic die with processor circuit, and are disposed along one side of the logic die with processor circuit.

According to some embodiments of the present disclosure, the IC structure further includes a second memory stack, a third memory stack, and a fourth memory stack. Each of them includes a plurality of semiconductor dies and an upward extending thermal conductivity layer. The plurality of semiconductor dies horizontally separate with each other, wherein each semiconductor die comprises a top surface, a bottom surface opposite to the top surface, and four sidewalls with a first sidewall, a second sidewall, a third sidewall and a fourth sidewall, and a plurality of edge pads arranged along the first sidewall, wherein the area of the bottom surface or the top surface is larger than that of any sidewall. The upward extending thermal conductivity layer between two adjacent semiconductor dies; wherein the thermal conductivity of the upward extending thermal conductivity layer is higher than that of Si or SiO2, wherein the first memory stack, the second memory stack, the third memory stack and the fourth memory stack are horizontally spaced apart from the logic die with processor circuit, and are disposed along four sides of the logic die with processor circuit, respectively.

According to some embodiments of the present disclosure, each edge pad of each semiconductor die includes an edge contact in a back-end-of-line (BEOL) region and a conductive via over the edge contact and in a dielectric layer at the top surface, wherein the area of the conductive via is greater than that of the edge contact.

According to some embodiments of the present disclosure, each edge pad of each semiconductor die includes an edge contact in a back-end-of-line (BEOL) region and a conductive via over the edge contact and in a redistribution layer (RDL) at the top surface, wherein the area of the conductive via is greater than that of the edge contact.

According to some embodiments of the present disclosure, the edge contact electrically connects to a signal pad in a back-end-of-line (BEOL) region of the semiconductor die surrounded by a seal ring structure.

According to some embodiments of the present disclosure, each edge pad of each semiconductor die includes a conductive line in a redistribution layer (RDL), the conductive line is electrically connected to a signal pad in a back-end-of-line (BEOL) region of the semiconductor die surrounded by a seal ring structure.

According to some embodiments of the present disclosure, the RDL includes a plurality of stacked dielectric layers within which the conductive line is located.

According to some embodiments of the present disclosure, a portion of the conductive line is configured to be disposed in a scribe line region of a semiconductor wafer prior to dicing of the semiconductor wafer.

BRIEF DESCRIPTION OF THE DRAWINGS

Aspects of the present disclosure are best understood from the following detailed description when read with the accompanying figures. It should be noted that, in accordance with the standard practice in the industry, various structures are not drawn to scale. In fact, the dimensions of the various structures may be arbitrarily increased or reduced for clarity of discussion.

FIGS. 2(d) and 2(e) show cross-sectional views of another memory die with multiple edge pads, according to some embodiments of the present disclosure.

DETAILED DESCRIPTION

Figure 1:
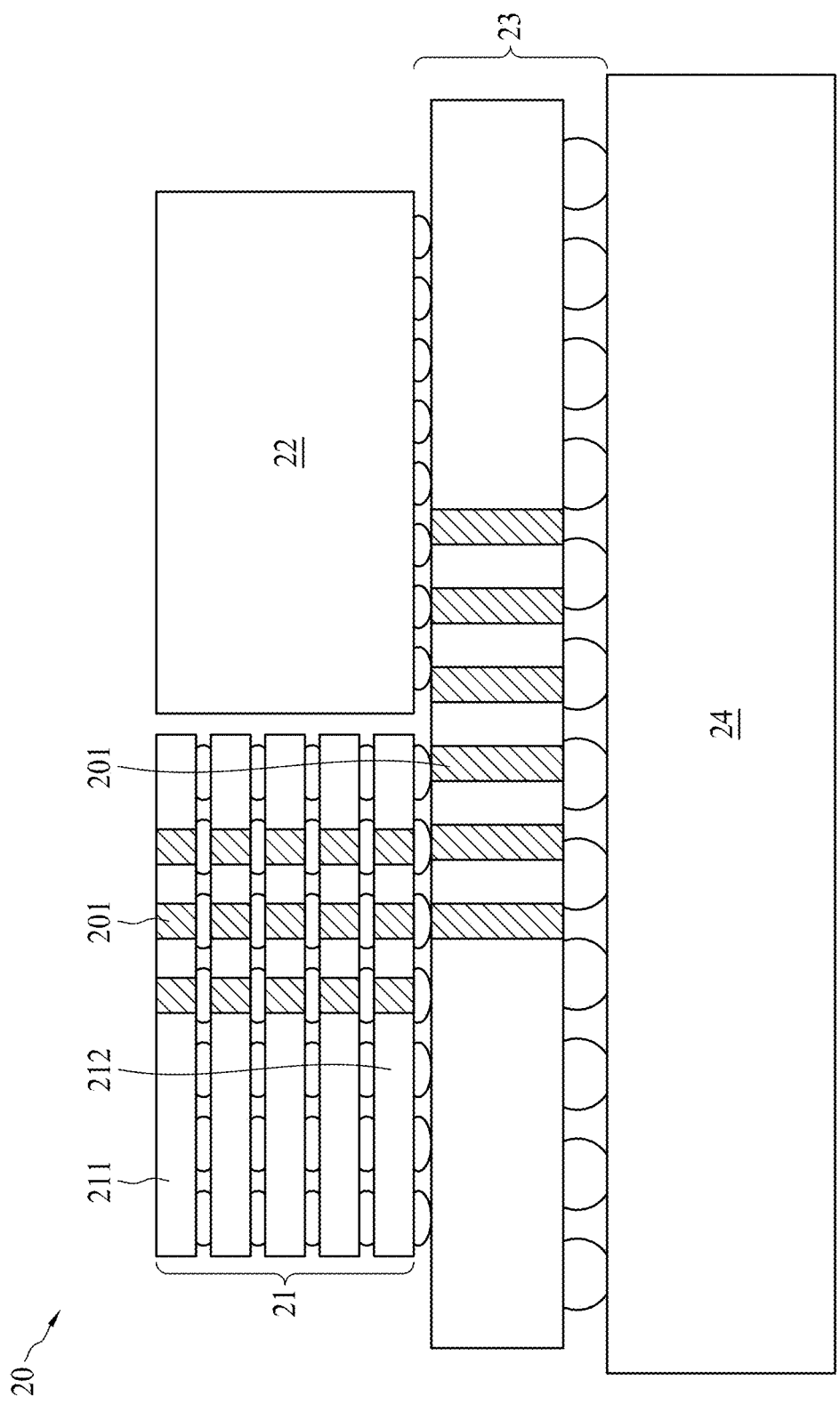
FIG. 1 shows a semiconductor COWOS structure, according to a comparative embodiment of the present disclosure.

The following disclosure provides many different embodiments, or examples, for implementing different features of the provided subject matter.

Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

In this invention, the side face(s) of memory dies are used for interconnecting dies in the 2.5D/3D IC stack to allow for skip-die signals and power distribution. Moreover, the high thermal conductivity material is disposed between two adjacent memory dies and thermally coupled to another high thermal conductivity material covering other side face of memory dies stack.

Figures 2A, 2B:
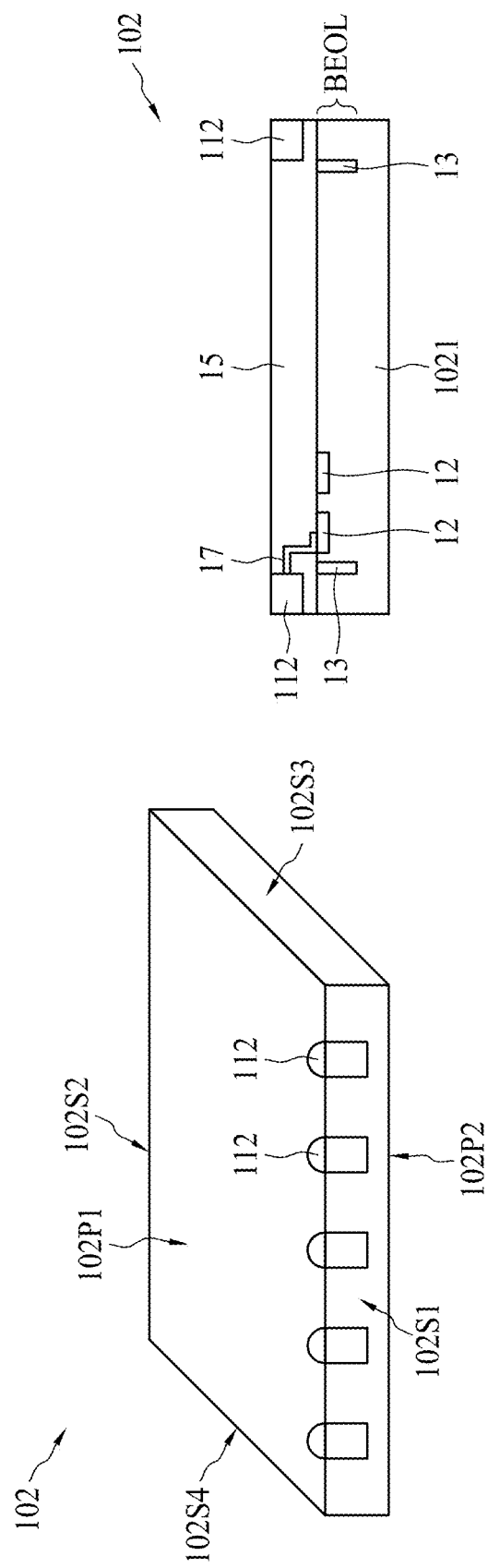
FIGS. 2(a) and 2(b) show a perspective view and a cross-sectional view, respectively, of a memory die with multiple edge pads, according to some embodiments of the present disclosure.

FIGS. 2(a) show a perspective view and a cross-sectional view of an edge-pad semiconductor die (or semiconductor die hereinafter) 102 according to some embodiments of the present disclosure. The edge-pad semiconductor die 102 has a top surface 102P1, a bottom surface 102P2, and four sidewalls 102S1, 102S2, 102S3, and 102S4, wherein the area of the top surface/bottom surface 102P1/102P2 is far larger than those of the sidewalls 102S1, 102S2, 102S3, and 102S4 (as shown in FIG. 2(a)). The semiconductor die 102 further includes "edge pads" 112 in the form of peripheral pads residing at the periphery or side faces or sidewalls (such as sidewalls 102S1, 102S2, 102S3, and/or 102S4) of the edge-pad semiconductor die 102 in FIG. 2(a).

Further, throughout the present disclosure, multiple edge-pad semiconductor dies 102 arranged in a stack or shelf can be named as new high bandwidth memory (NuHBM) or NuHBM system. Hereinafter, the NuHBM system may be also referred to the memory stack or memory shelf (or NuHBM stack or NuHBM shelf), which includes a plurality of edge-pad semiconductor dies or exemplary semiconductor memory die 102 shown in FIG. 2(a).

Referring to FIG. 2(b), in one embodiment, the edge-pad semiconductor die 102 includes a memory die 1021 and a redistribution layer (RDL) 15 over a top surface of the memory die 1021. The memory die 1021 can also be a DRAM die. In one embodiment, there is no through-silicon-vias (TSVs) in the memory die 1021 of the edge-pad semiconductor die 102 which includes edge pads along one the side surface. There are one or more signal pads 12 within the memory die 1021, and a seal ring 13 surrounding the signal pad 12. The memory die 1021 may include a BEOL (back end of line) region arranged on a front side of the memory die 1021. In one embodiment, each edge pad 112 of each semiconductor die 102 includes the conductive line 17 in the redistribution layer 15 (RDL), and the conductive line 17 is electrically connected to the signal pad 12 in the back-end-of-line (BEOL) region of the semiconductor die 102 surrounded by the seal ring 103.

Referring to FIG. 2(b), in the substrate of the memory die 1021, all signal pads 12 are located within a region defined by the seal ring 13 of the substrate, and the edge pads 112 are located in the RDL 15 and electrically connected to the signal pads 12 (see of FIG. 2(b)) in the BEOL region.

In some embodiments, the interconnect structure of the RDL 15 may include a plurality of conductive line layers, a plurality of conductive vias, and one or more edge pads 112. The conductive lines, conductive vias and edge pads together construct the various conduction paths of the interconnect structure. FIG. 2(b) shows a conductive line 17 and vertical conductive vias arranged in the RDL 15 and electrically connecting the signal pad 12 to the edge pads 112.

Figure 2C:
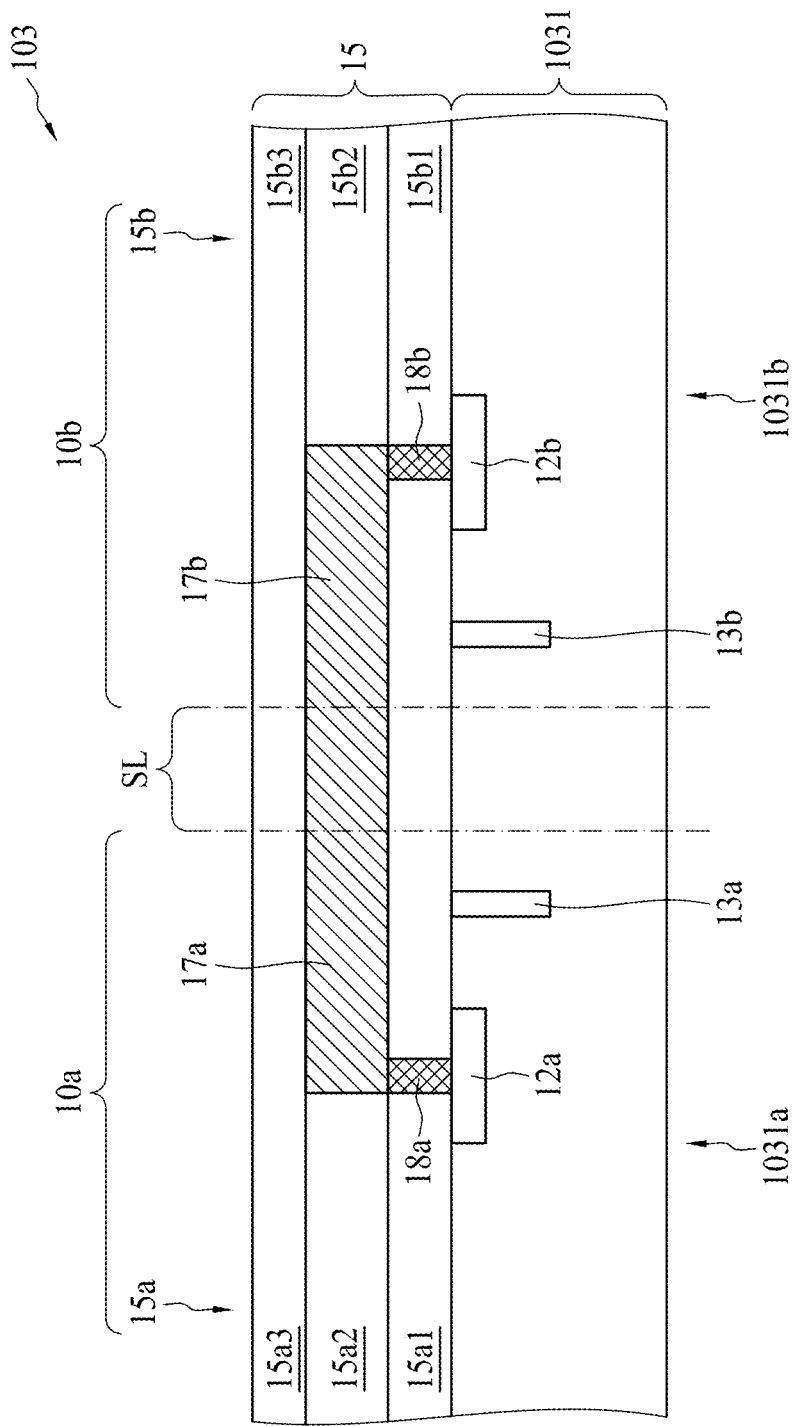
FIG. 2(c) shows a cross-sectional view of a semiconductor wafer containing memory dice with multiple edge pads, according to some embodiments of the present disclosure.

FIG. 2(c) shows a cross-sectional view of a portion semiconductor wafer 103 containing multiple edge-pad semiconductor dies according to some embodiments of the present disclosure. In some embodiments, as shown in FIG. 2(c), a plurality of edge-pad semiconductor dies, e.g., exemplary edge-pad semiconductor dies 10a and 10b, are formed on a semiconductor wafer 103. The boundaries of the adjacent edge-pad semiconductor dies 10a and 10b are defined by scribe line regions SL. In some embodiments, each edge-pad semiconductor die 10a or 10b includes a memory die 1031a or 1031b and an RDL 15a or 15b disposed over the respective memory die 1031a or 1031b. The memory die 1031a or 1031b further includes signal pads 12a or 12b, and seal rings 13a or 13b, in the memory dies 1031a and 1031b, respectively. Furthermore, the RDL 15a or 15b includes one or more conductive lines 17a or 17b or vias 18a or 18b, whichever appropriate for RDL design, electrically connected to the corresponding signal pads 12a or 12b, respectively. The RDL 15a (or 15b) further includes stacked dielectric or isolating layers 15a1, 15a2 and 15a3 (or 15b1, 15b2, 15b3), within which the conductive line 17a or 17b is located. In some embodiments, the exposed portion of the conductive line or via 17a or 17b after wafer dicing performed in the scribe line region SL serves as the edge pad as previously described, such as shown in FIGS. 2(b). The dielectric or isolating layers in one embodiment may be made of $SiO_2$.

FIGS. 2(d) and 2(e) show cross-sectional views of the edge-pad semiconductor die or chip 102, according to some embodiments of the present disclosure. In some embodiments, the memory die 1021 of the edge-pad semiconductor die 102 has edge contacts 111 formed during the manufacturing process of the BEOL region, such as formed in a M4 or M5 metal layer. To increase the contact area of the edge pad, a dielectric layer 16 with one or more conductive via 112 or conductive lines is formed over the memory die 1021. Referring to FIG. 2(d), the conductive via 112 may correspond to or be aligned with the respective edge contacts 111. In some embodiments, the area (for example, the exposed lateral area) of the conductive via 112 is greater than that of the edge contact 111. In some embodiments, the edge contact 111 is electrically or physically connected to the corresponding conductive via 112.

Thus, each edge pad 110 of the edge-pad semiconductor die 102 may include an edge contact 111 and a conductive via 112. In another embodiment, the dielectric layer 16 is replaced by the RDL 15, as shown in FIG. 2(e). Same numeral labels in FIG. 2(d) and FIG. 2(e) refer to substantially identical or functionally identical components and the associated description can be referred thereto without repeating here for brevity.

Figures 3A, 3B:
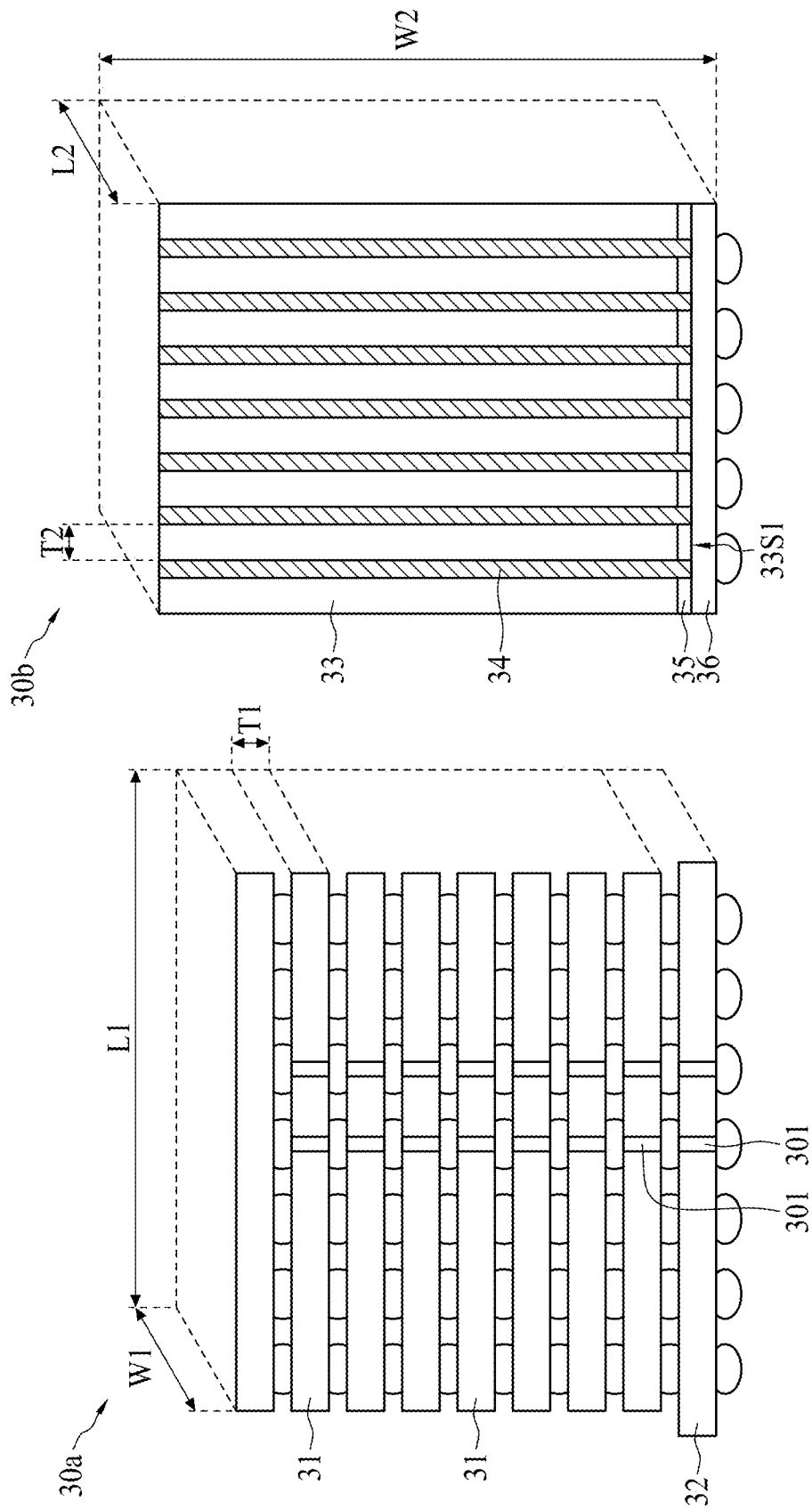
FIG. 3(a) shows a perspective view of a conventional high-bandwidth memory (HBM) structure.
FIG. 3(b) shows a perspective view of a new high-bandwidth memory (NuHBM) stack or shelf, according to some embodiments of the present disclosure.

FIG. 3(a) shows a perspective view of a conventional high-bandwidth memory (HBM) structure 30a, which includes a plurality of DRAM chips 31 (such as 12 chips for HBM3 or 16 chips for HBM4) vertically stacked together above a controller 32, wherein each DRAM chip 31 has a width W1 about 9.5 mm, a length L1 about 10.5 mm, and a thinner thickness T1 about 0.05 mm due to the requirement of multiple TSVs 301 therein. Usually, four DRAM chips 31 are grouped together to output 1K bits of data bus width, wherein each DRAM chip 31 outputs 256 bits. Thus, when 12 DRAM chips in the HBM3 configuration are divided into three group, each group with 4 DRAM chips can output 1K bits of data, respectively.

FIG. 3(b) shows a perspective view of a NuHBM stack or shelf 30b, according to some embodiments of the present disclosure. In contrast to the conventional HBM structure 30a, the NuHBM stack or shelf 30b of the present invention includes a plurality of edge-pad semiconductor dies 33, a plurality of high thermal conductivity layer 34 (optionally), and a memory controller 36. In some embodiments, the plurality of edge-pad semiconductor dies 33 are horizontally separate or horizontally stacked together, such as 16 or 24 chips or more. In some embodiments, each edge-pad semiconductor chips 33 has a width W2 of about 9.5 mm, a length L2 of about 10.5 mm (like the one used in the HBM stack structure 30a), and a regular thickness T2 about 0.5 mm without TSVs therein. Moreover, for heat dissipation purposes, the high thermal conductivity "HTC" material or layer 34 (such as SiC/AlN/BN/W/Cu/undoped polysilicon/ large crystalline silicon . . . ) is disposed adjacent to one edge-pad semiconductor chip 33 respectively, or disposed between two disposed edge-pad semiconductor chips 33. Furthermore, although not separately shown in FIG. 3(b), one or more HTC material or layers, e.g., the feature 606 shown in FIG. 6(a), could be used to cover the top of the edge-pad semiconductor dies or chips 33 and couple to the other HTC layer 34 between the edge-pad semiconductor dies 33.

The NuHBM shelf 30b may further include a plurality of edge pads 35 arranged along a lower sidewall 33S1 in the direction of the length L2 about 10.5 mm. For example, when the hybrid bonding with a bonding pitch of about 5 μm is used, each edge-pad semiconductor die 33 has 2100 edge (I/O) pads 35 (10.5 mm/5 μm=2100) in the direction of the length L2; and when solder ball bonding with a bonding pitch of about 30 μm is used, each edge-pad semiconductor die 33 has 350 edge pads 35 (10.5 mm/30 μm=350), and when the bonding pitch is 40 μm and the length L2 is 10.5 mm, it could provide 262 edge pads 35 (with a 128-bit output data for I/O). If necessary, an edge RDL (see U.S. application Ser. No. 18/471,670, and U.S. application Ser. No. 19/059,275, all content of which is incorporated by reference herein) could be optionally used for the formation of edge pads. Therefore, suppose one half of the edge pads 35 are used for data I/O, each edge-pad semiconductor chip 33 could have 175-bit output data (assuming a bonding pitch of about 30 μm) or 1K-bit output data (a bonding pitch of about 5 μm), or other numbers of the edge pads 35 depending on the different bonding pitches. The plurality of edge-pad semiconductor dies 33 (i.e., NuHBM stack or shelf) are electrically coupled to the memory controller 36 through the edge pads 35, such that the memory controller 36 can output the data with a desired data width based on the number of output data of one edge-pad semiconductor die 33, the combined output data of two or more edge-pad semiconductor dies 33, or the combined output data of all edge-pad semiconductor dies 33.

Figures 4A, 4B:
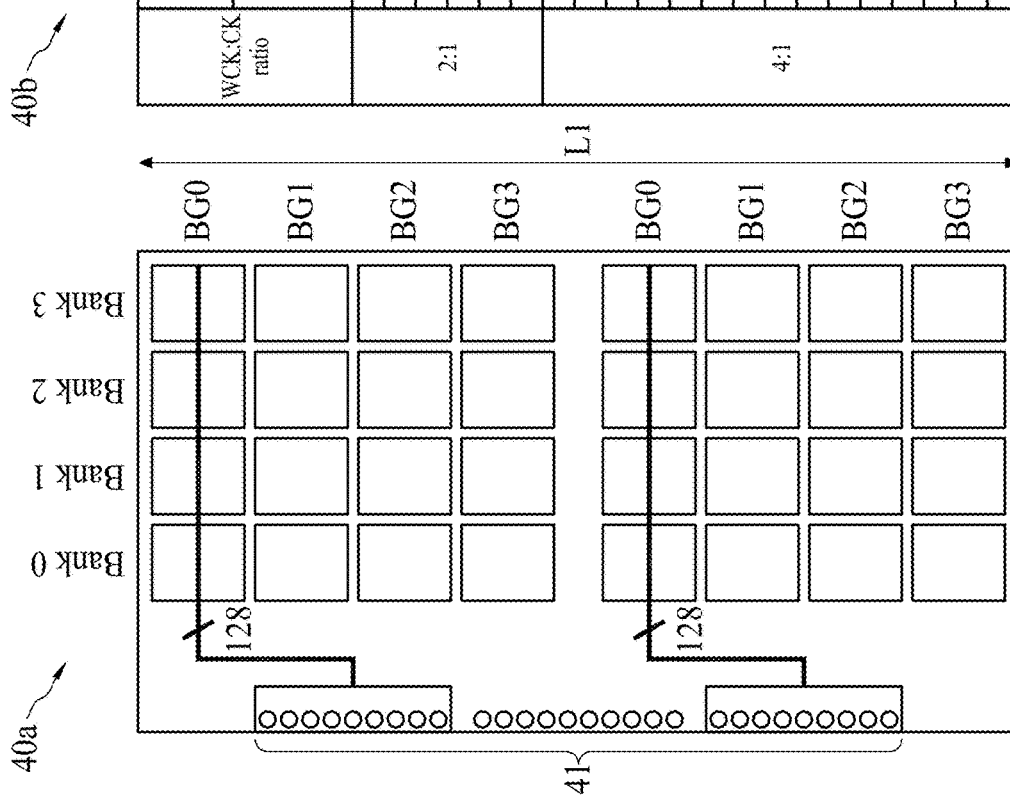
FIGS. 4(a) and 4(b) respectively show an exemplary layout 40a and a specification table for low power double data rate 5 (LPDDR5) memory, according to some embodiments of the present disclosure.

FIGS. 4(a) and 4(b) respectively show an exemplary layout 40a and a specification table for a low power double data rate 5 (LPDDR5) memory chip. The 16 Gb (gigabit) LPDDR5 memory chip 40a may have an area of around 47 $mm^2$, in which all pads 41 of the LPDDR5 chip 40a are located close to the edge of the chip with a data width of 16 bits. Each I/O pad 41 has a bandwidth of about 9.6 Gb/s. In the event the 16 Gb LPDDR5 memory chip 40a is used for the edge-pad semiconductor chip of the present invention, it may have 759 edge pads 35 along the direction of a length L1 of about 7.59 mm when the boning pitch is about 10 μm, wherein assuming one half of the edge pads 35 are used for data I/O, each edge-pad semiconductor die adopting the LPDDR5 memory chip 40a could have a data bus width of 379 bits. If four such 16 Gb LPDDR5 memory chips 40a are horizontally stacked together as an NuHBM shelf, each NuHBM shelf can have a data bus width of 1516 bits (379 bits×4) and a bandwidth around 14553 Gb/s (1516×9.6 Gb/s).

Figure 5:
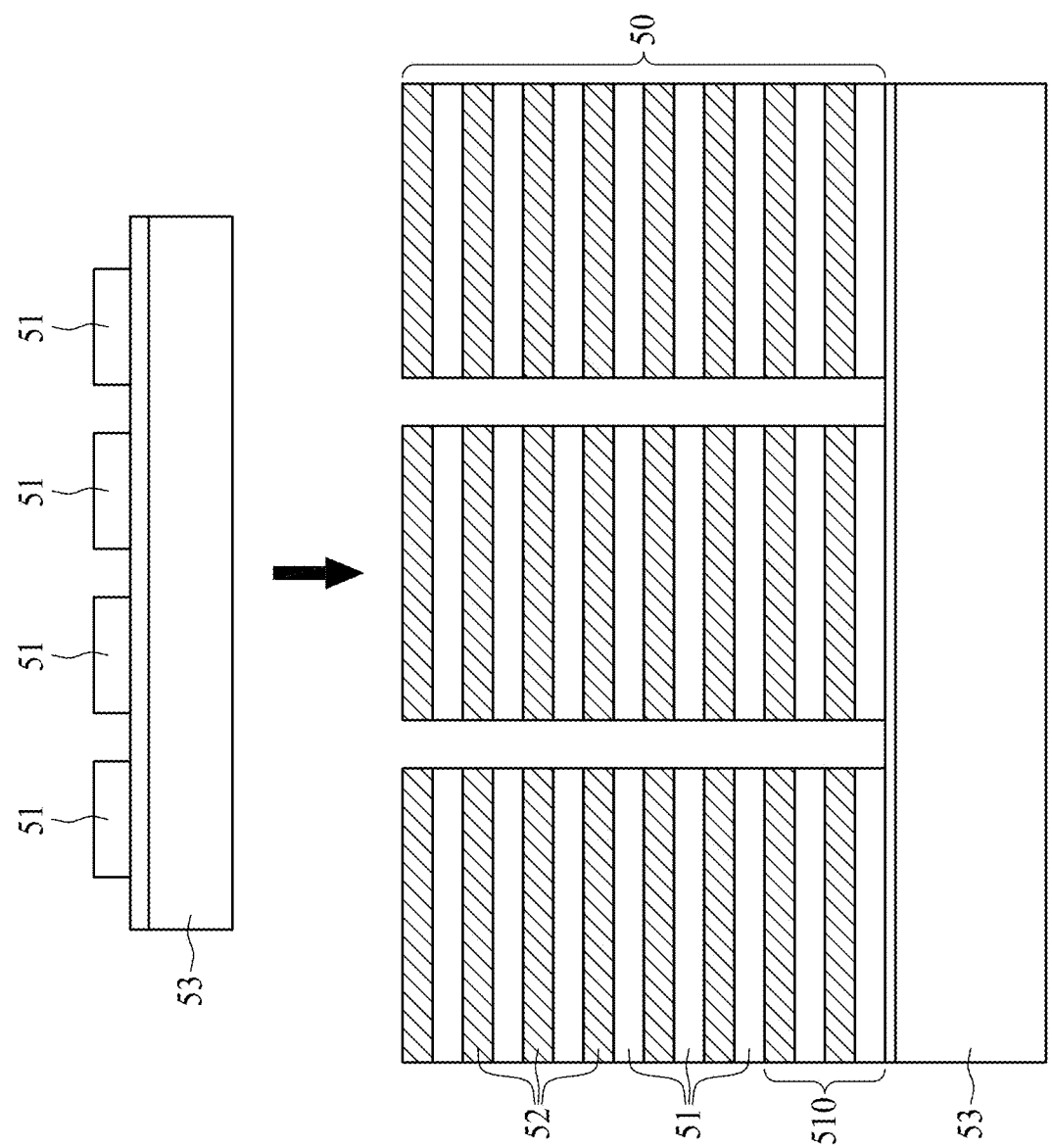
FIG. 5 shows cross-sectional views of intermediate stages of forming a NuHBM stack or shelf, according to some embodiments of the present disclosure.

FIG. 5 shows cross-sectional views of intermediate stages of forming a NuHBM stack or shelf 50, according to some embodiments of the present disclosure. As shown in an upper plot and a lower plot of FIG. 5, multiple NuHBM stack or shelf 50 can be formed by bonding multiple edge-pad semiconductor chips 51 and HTC layers 52 to a carrier 53, followed by:

(1) Stacking more edge-pad semiconductor chips 51 of the same size to first form a short NuHBM stack 510, wherein, a high thermal conductivity "HTC" material or layer 52 (such as AlN/BN/W/Cu/ . . . ) are inserted between two adjacent edge-pad semiconductor chips 51. In some embodiments, the thermal conductivity (or thermal conductivity coefficient) of the high thermal conductivity layer 52 is higher than that of Si or $SiO_2$.

(2) Combining multiple short NuHBM stacks 510 together to form the NuHBM shelf 50 which are thick enough for ease of subsequent processing.

(3) Performing carrier release of the carrier 53, and release the NuHBM shelf 50.

Figure 6A:
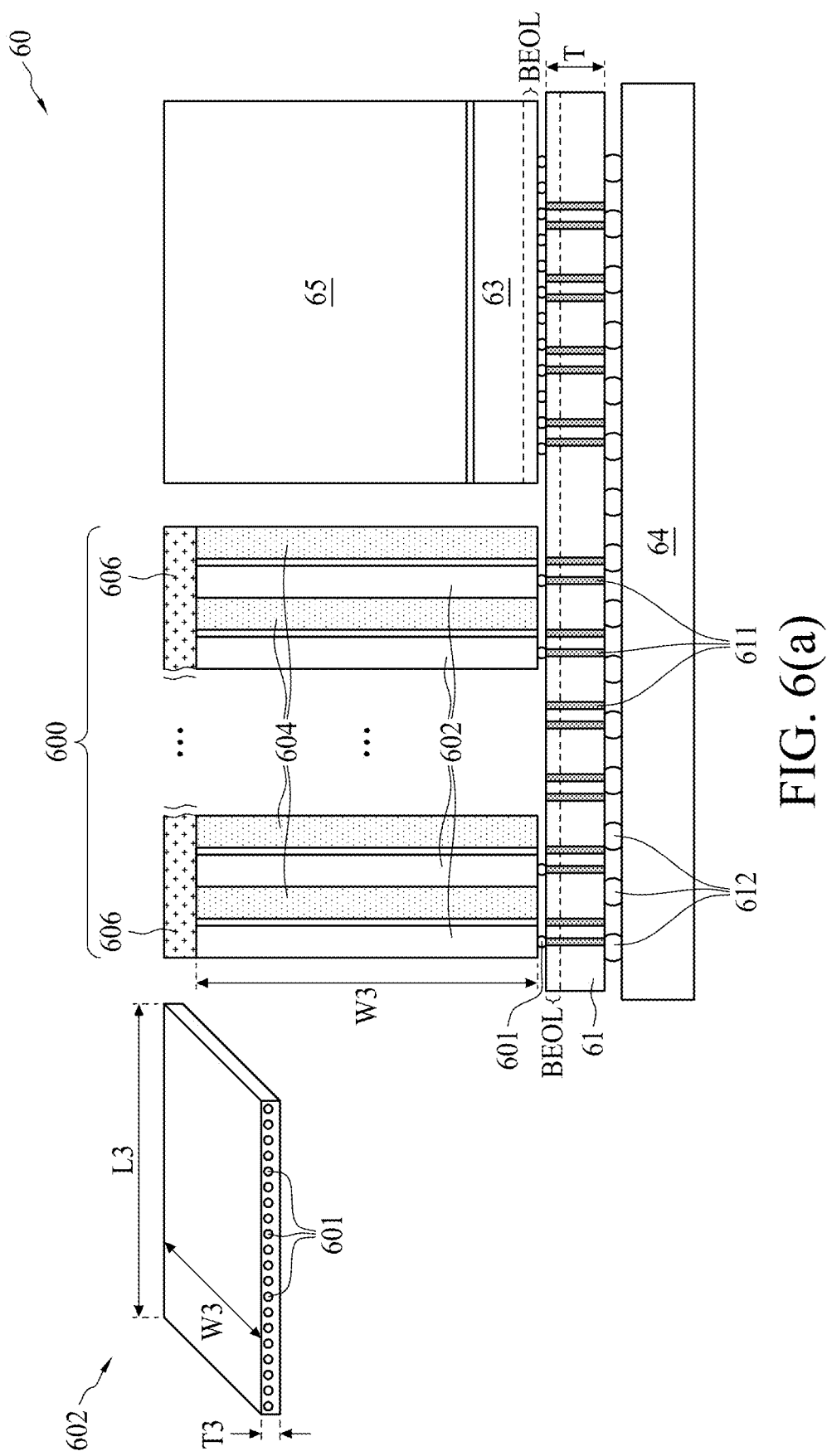
FIGS. 6(a) to 6(c) show an IC structure with NuHBM shelf, according to some embodiments of the present disclosure.
Figure 6B:
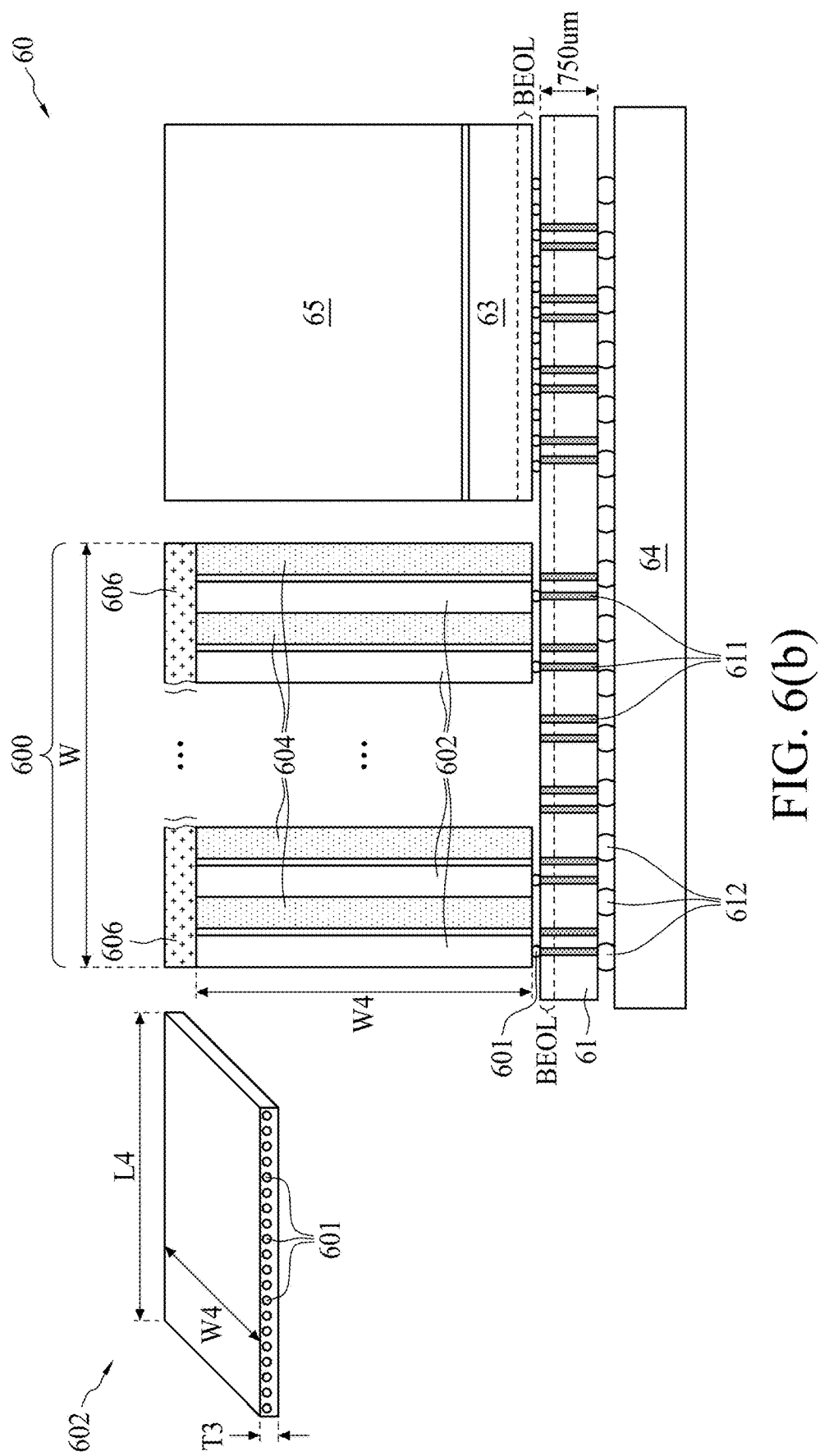
Figure 6C:
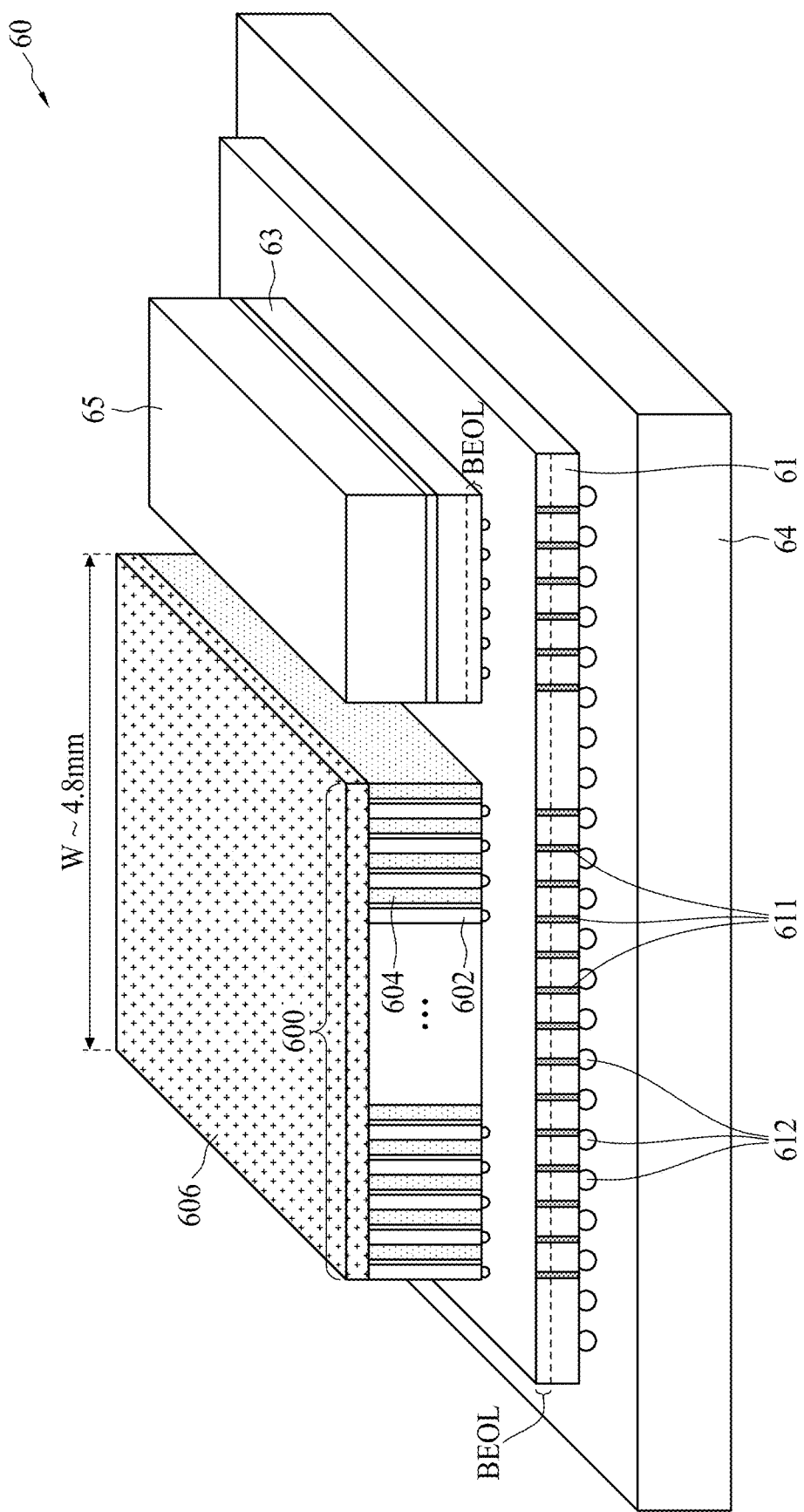

The present invention further utilizes the NuHBM system for 3D IC without using wafer or interposer in the COWOS structure 20 shown in FIG. 1. FIGS. 6(a) to 6(c) show a 3D IC structure 60 according to some embodiments of the present disclosure. As shown in a right plot of FIG. 6(a), the 3D IC structure 60 includes (1) a package substrate 64, (2) a memory controller 61 (also referred to as "logic die with memory controller" throughout the present disclosure), (3) an NuHBM shelf 600, (4) an SOC (System-on-a-Chip) chip 63 (also referred to as "logic die with processor circuit" throughout the present disclosure) and (5) optionally a heat sink 65. The NuHBM shelf or stack 600 includes a plurality of edge-pad semiconductor dies (or semiconductor dies) 602, optionally a plurality of high thermal conductivity layers 604 (also referred to as "upward extending high thermal conductivity layer" throughout the present disclosure) and optionally a top-high thermal conductivity layer 606 (also referred to as "laterally extending high thermal conductivity layer" throughout the present disclosure). There may be another adhesive layer between the edge-pad semiconductor die 602 and the high thermal conductivity layer 604.

The NuHBM shelf 600 and the SOC chip 63 are electrically bonded to the memory controller 61. The memory controller 61 is bonded to the package substrate 64. Thus, there is no silicon interposer between the NuHBM shelf 600 (or the memory controller 61) and the package substrate 64. The heat sink 64 may be disposed over the SOC chip 63 and have a top surface substantially level with a top surface of the NuHBM shelf 600.

In some embodiments, the package substrate 64 is a PCB (printed circuit board) substrate. The package substrate 64 may be a laminated substrate formed of multiple layers of copper foils with electrically insulating laminated materials, in which the laminated materials include fiberglass-reinforced epoxy resins, also known as FR-4, Teflon, polyimide, ceramic, or other suitable materials.

Any commercially available DRAM die, such as DDR4 die, DDR5 die, LDDR4 die, LDDR5 die, or GDDR7 die, etc. could be used as the edge-pad semiconductor die 602. For example, as shown in a left plot of FIG. 6(a), each edge-pad semiconductor die 602 in an example has a die size of about 5 or 6.25 mm (for a width W3), 10 mm (for a length L3), and 100 µm (for a thickness T3). Each edge-pad semiconductor die 602 may include edge pads 601 arranged along a sidewall in the lengthwise direction of the edge-pad semiconductor die 602. Thus, in some embodiments, each edge-pad semiconductor die 602 could have the edge pads 601 with a number of about 500 when the pad pitch is about 20 µm (10 mm/20 µm) in the lengthwise direction (L3), wherein at least 250 edge pads 601 or more could be used as data pads.

Nevertheless, embodiments of the present invention could be used in different die sizes of the edge-pad semiconductor die 602 and different bonding pitches for the edge pads 601. For example, referring to FIG. 6(b), each edge-pad semiconductor die 602 could have a reticle size or maximum scanner field area (MSFA) with 26 mm (for a width W4)×33 mm (for a length L4). In the event the bonding pitch about 100 µm is used, each edge-pad semiconductor die 602 could have 330 I/O edge pads 601 along the length direction with 33 mm, wherein suppose one half of 330 I/O edge pads 601 could be used for a data bus, that is, a data width of 165-bit I/O edge pads 601. If the NuHBM system 600 includes 24 edge-pad semiconductor dies 602, there are 3,960 data I/O edge pads 601 (24×165=3,960) for the NuHBM system 600 in the depicted embodiment, which is larger than the data width of 2K bits used in the HBM4 specification. Such edge-pad semiconductor die 602 with a 26 mm (for the width W4)×33 mm (for the length L4) reticle may have about 172.7 to 207.2 Gb capacity. For example, a DRAM cell size for one bit storage is about 0.002484 µm$^2$, and if the cell efficiency is 50%, then 33 mm×26 mm×0.5/0.002484 µm$^2$=172.7 Gb (gigabits), or if cell efficiency is 60%, then 33 mm×26 mm×0.6/0.002484 µm$^2$=207.2 Gb. Thus, in the event there are 24 edge-pad semiconductor dies 602 combined together in one NuHBM system 600, the NuHBM system 600 can provide a capacity of about 518.1 to 621.6 GB (24×172.7 Gb to 24×207.2 Gb). Of course, bigger edge-pad semiconductor die 602 could be used as well for bigger storage capacity in the present invention, for example, each edge-pad semiconductor die 602 could have a die size of about 26×2 mm (for a width W), 33×3 mm (for a length L), and 100 µm (for a thickness T), and this die area is equal to 6 reticle sizes (each reticle size is expressed by 26 mm×33 mm). Each edge-pad semiconductor die 602 may include edge pads 601 arranged along a sidewall in the lengthwise direction of the edge-pad semiconductor die 602. Thus, in some embodiments, each edge-pad semiconductor die 602 could have the edge pads 601 with a number of about 5K when the pad pitch is about 20 µm (99 mm/20 µm) in the lengthwise direction (L3), wherein at least 2.5K edge pads 601 or more could be used as data pads.

FIG. 6(c) is the stereoscopic view of FIG. 6(a) or FIG. 6(b), as mentioned, the power/control/data signals of each edge-pad semiconductor die 602 of the NuHBM system 600 could be propagated to the memory controller 61 without through other edge-pad semiconductor dies 602. Moreover, since there is high thermal conductivity layer 604 (such as AlN, BN, W, SiC, Copper, etc.) between two adjacent edge-pad semiconductor die 602 and connected to a top-high thermal conductivity layer 606 on other sidewall(s) of the NuHBM system 600, the heat generated from those edge-pad semiconductor dies 602 could be spread through the high thermal conductivity layer 604 to the top-high thermal conductivity layer 606, and passed to other heat sink (not shown) connected to the top-high thermal conductivity layer 606. It should be noted that FIG. 6(a), FIG. 6(b), and FIG. 6(c) of this embodiment are just sketched and exemplary drawings, and the components in those drawings may not be proportional to their real sizes.

As shown in FIG. 6(c), in the event each edge-pad semiconductor die 602 has a length of 33 mm and a width of 26 mm (that is, the die area is equal one reticle size by 26 mm×33 mm), to accommodate the NuHBM system 600 with such edge-pad semiconductor dies 602, the die area of the memory controller 61 could be 26 mm (width)*66 mm (length), which is around 2 reticle sizes. However, since the width (W) of the NuHBM system 600 with 24 edge-pad semiconductor dies 602 and 24 high thermal conductivity layers 604 is just around 4.8 mm (the thickness of each edge-pad semiconductor die 602 and each high thermal conductivity layer 604 is around 100 µm), the rest of the die area of the memory controller 61 could still accommodate another SOC chip 63, such as CPU, GPU, etc. The area of the memory controller 61 is dependent on the size and number of the NuHBM system 600 and the SOC chip 63. Furthermore, it is possible that there are two or more NuHBM system 600 over the memory controller 61.

Both of the SOC die 63 and the edge-pad semiconductor dies 602 are designed to be disposed over the surface of the memory controller 61. Their IOs are well connected by monolithic interconnections. The outgoing pads of the SOC die 63 are made in the electrical connection to the package substrate 64 through the memory controller 61. On the memory controller 61, the controller circuits are designed at the front surface, shown by a dash line with a label "BEOL" (back end of line), well connected to the IOs of the SOC die 63 designed at the bottom surface (shown by a dash line with a label "BEOL"). In this memory controller 61, TSVs 611 are made across the die thickness, and micro bumps or hybrid bumps 612 are electrically connected to the TSVs 611. The IOs of the SOC die 63 could be electrically connected to the IOs edge pads of semiconductor dies 602 through the memory controller 61. Then the memory controller 61 is electrically connected to the package substrate 64 with properly designed alignment. In some embodiments, the thickness (T) of the memory controller 61 is about 750 μm.

Although in this example the memory controller 61 is facing upward (shown by a dash line with the label "BEOL" in FIG. 6(*a*)), in another example the memory controller 61 could be facing downward or flipped and connected to the package substrate 64. Since there are TSVs 611 in the memory controller 61, the edge-pad semiconductor dies (or semiconductor dies) 602 could be electrically connected to the memory controller 61 through the TSVs 611 therein or RDLs (not shown) over the memory controller 61.

These IOs output high-bandwidth data, and the memory controller 61 can be designed to select an appropriate number of IOs (such as, a portion of data IOs of one semiconductor die 602, all data IOs of one semiconductor die 602, portion of data IOs of multiple semiconductor dies 602, or all data IOs of multiple semiconductor dies 602) either by a cross-bar circuit design. In another embodiment, SRAM array is used to conduct the data IOs of the NuHBM shelf 600 from part or all semiconductor dies 602. For example, a plurality of SRAM arrays are respectively corresponding to the plurality of semiconductor dies 602, and each SRAM array temporarily holds the selected appropriate number of IOs from the corresponding semiconductor dies 602. In some embodiments, the plurality of edge pads 601 of each semiconductor die 602 includes a subset of data pads, and the memory controller 61 selects a predetermined data bits from the data pads 601 of one semiconductor die 602, a portion of the plurality of semiconductor dies 602, or all the plurality of semiconductor dies 602. The selected appropriate number of IOs of each semiconductor die 602 could be set by a mode register in each semiconductor dies 602.

As previously mentioned, the memory controller 61 of the present invention includes multiple TSVs 611, such that the power/control/data signals of each semiconductor die 602 and/or the SOC die 63 could be received or transmitted through the memory controller 61 to the package substrate 64, as shown in FIG. 6 (*a*). Additionally, the heat sink 65 is disposed over the SOC die 63, such that the top surface of the combination of the heat sink 65 and the SOC die 63 could be level with the top surface of the NuHBM shelf 600.

Figure 7A:
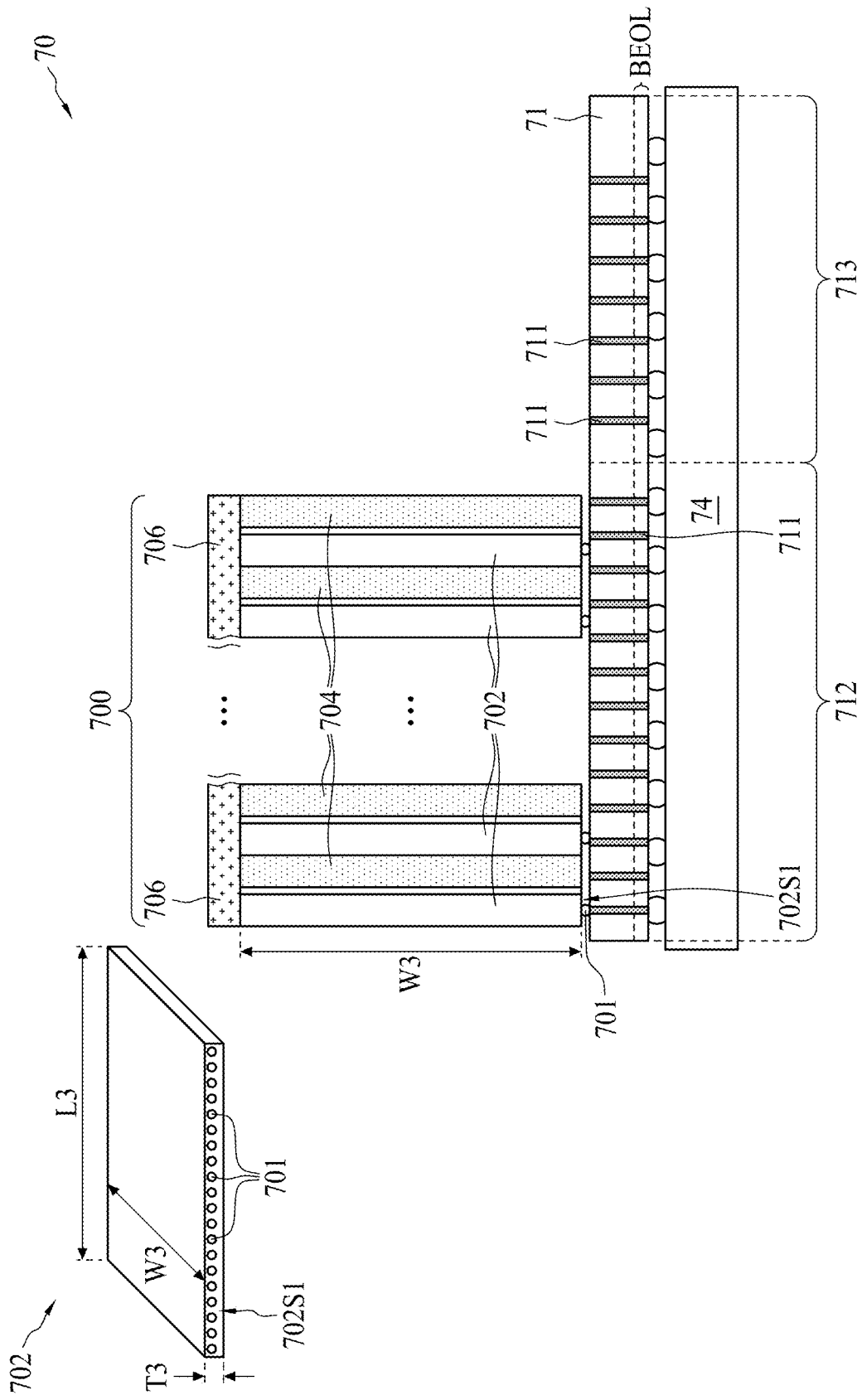
FIGS. 7(a) and 7(b) show another IC structure with NuHBM shelf, according to some embodiments of the present disclosure.
Figure 7B:
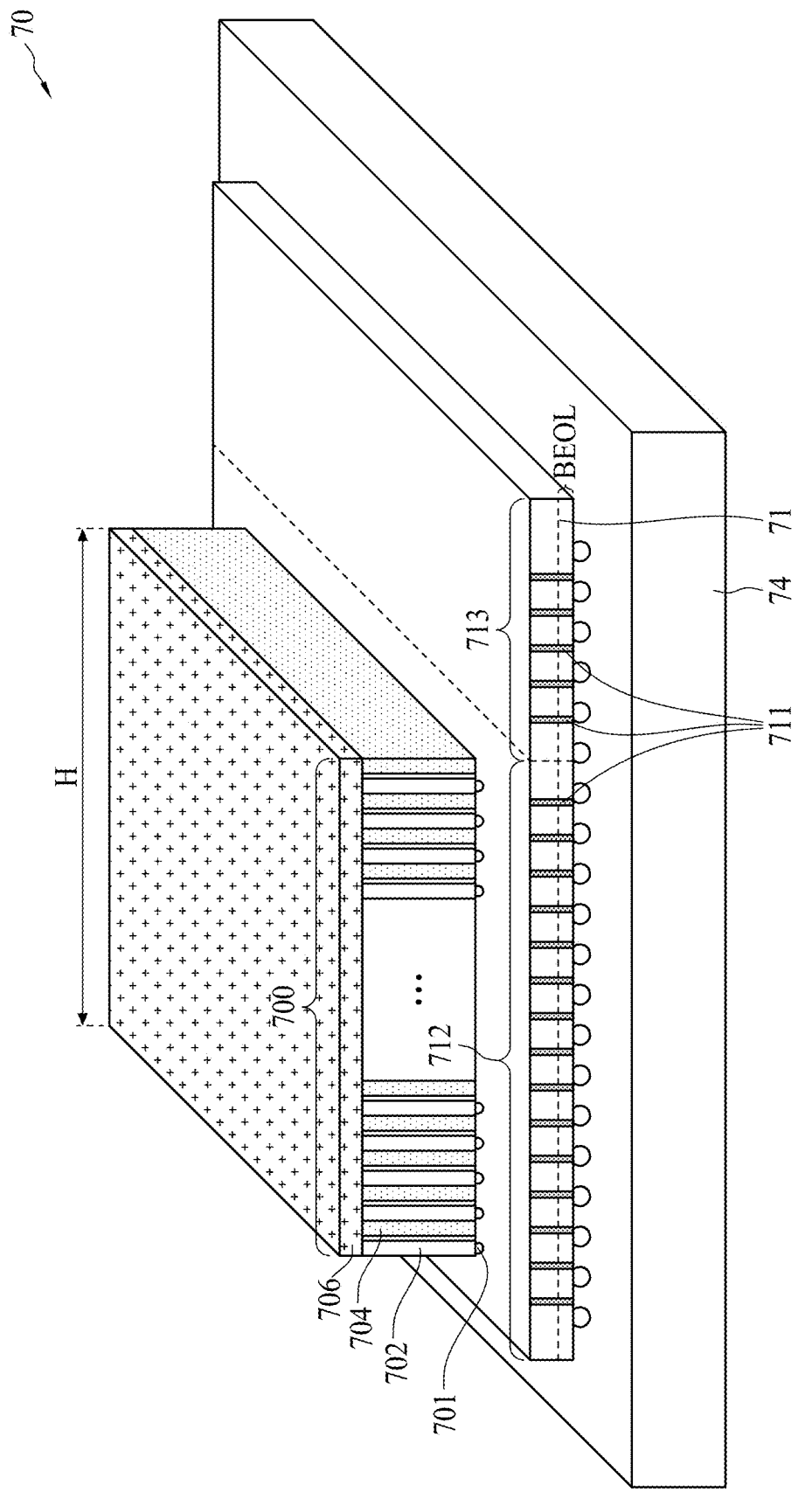

FIG. 7(*a*) shows another 3D IC structure 70 according to some embodiments of the present disclosure, and FIG. 7(*b*) is the stereoscopic view of the 3D IC structure 70. As shown in a right plot of FIG. 7(*a*), the 3D IC structure 70 includes a package substrate 74, a logic die 71 including memory controller and processor circuit, and an NuHBM system or stack 700 which includes a plurality of edge-pad semiconductor dies 702, optionally a plurality of high thermal conductivity layers 704 and optionally a top-high thermal conductivity layer 706. The NuHBM system 700 is electrically connected to the package substrate 74 through the logic die 71. Each semiconductor die 702 may include edge pads 701 arranged along a sidewall 702S1 in the lengthwise direction (L3) of the semiconductor die 702. The materials and configurations of the package substrate 74, the edge-pad semiconductor dies 702, the high thermal conductivity layer 704 and the top-high thermal conductivity layer 706 are similar to those of the package substrate 64, the edge-pad semiconductor dies 602, the high thermal conductivity layer 604 and the top-high thermal conductivity layer 606, respectively, and details of these features are not repeated for brevity.

As shown in FIG. 7(*a*), the SOC die (or processor circuit) is combined with the memory controller to be a single logic die, that is, the logic die 71 under the NuHBM shelf 700 includes not only the memory controller 712, but also the SOC die 713 (such as GPU, CPU, NPU, TPU, FPGA, etc.), and the memory controller 712 of the logic die 71 could be disposed right under the NuHBM shelf 700. In this embodiment, the logic die 71 is disposed over the packaging substrate 74 in a flip-chip manner, that is, the memory controller 712 and the SOC 713 circuits are designed at the bottom surface of the logic die 71 (shown by a dash line with a label "BEOL"). The logic die 71 further includes TSVs 711 penetrating through the logic die 71 (especially from the memory controller circuit to the NuHBM shelf 700), and may include RDLs (not shown) on both sides of the optionally. Of course, there could be a heat sink (not shown) over the SOC die area, such that the top surface of the heat sink could be level with the top surface of the NuHBM shelf 700. Similarly, FIG. 7(*a*) and FIG. 7(*b*) of this embodiment are just sketched and exemplary drawings, and the components in those drawings may not be proportional to their real sizes.

Moreover, since the NuHBM shelf 700 includes high thermal conductivity layer 704 (such as AlN, BN, W, Copper, etc.) between two adjacent semiconductor dies 702 and connected to a top-high thermal conductivity layer 706 on other sidewall(s) of the NuHBM shelf 700, heat generated from those semiconductor dies 702 could be spread through the high thermal conductivity layer 704 to the top-high thermal conductivity layer 706, and passed to other heat sink (not shown) connected to the top-high thermal conductivity layer 706.

Although in this example the logic die 71 is facing downward (shown by a dash line with a label "BEOL" shown in FIG. 7(*a*)), in another example the logic die 71 could be facing upward. Since the logic die 71 includes TSVs 711 and may further include RDLs, the logic die 71 could be electrically connected to the package substrate 74 through the TSVs 711 in this embodiment. Moreover, the signal and the power connections/transmissions in the present invention could be either based on the logic die 71, or based on the package substrate 74 (through the logic die 71).

FIG. 8(*a*) shows another 3D IC structure 80 according to some embodiments of the present disclosure, and FIG. 8(*b*) is the stereoscopic view of the 3D IC structure 80. As shown in a right plot of FIG. 8(*a*), the 3D IC structure 80 includes a package substrate 84, a logic die 81 including memory controller and processor circuit, and an NuHBM system or NuHBM shelf 800 which includes a plurality of edge-pad semiconductor dies 802, optionally a plurality of high thermal conductivity layers 804 and optionally a top-high thermal conductivity layer 806. Each semiconductor die 802 may include edge pads 801 arranged along a sidewall 802S1 in the lengthwise direction (L3) of the semiconductor die 802. The NuHBM system 800 is physically and electrically bonded to the package substrate 84. The materials and configurations of the semiconductor dies 802, the high thermal conductivity layer 804 and the top-high thermal conductivity layer 806 are similar to those of the semiconductor dies 602, the high thermal conductivity layer 604 and the top-high thermal conductivity layer 606, respectively, and details of these features are not repeated for brevity.

Figure 8A:
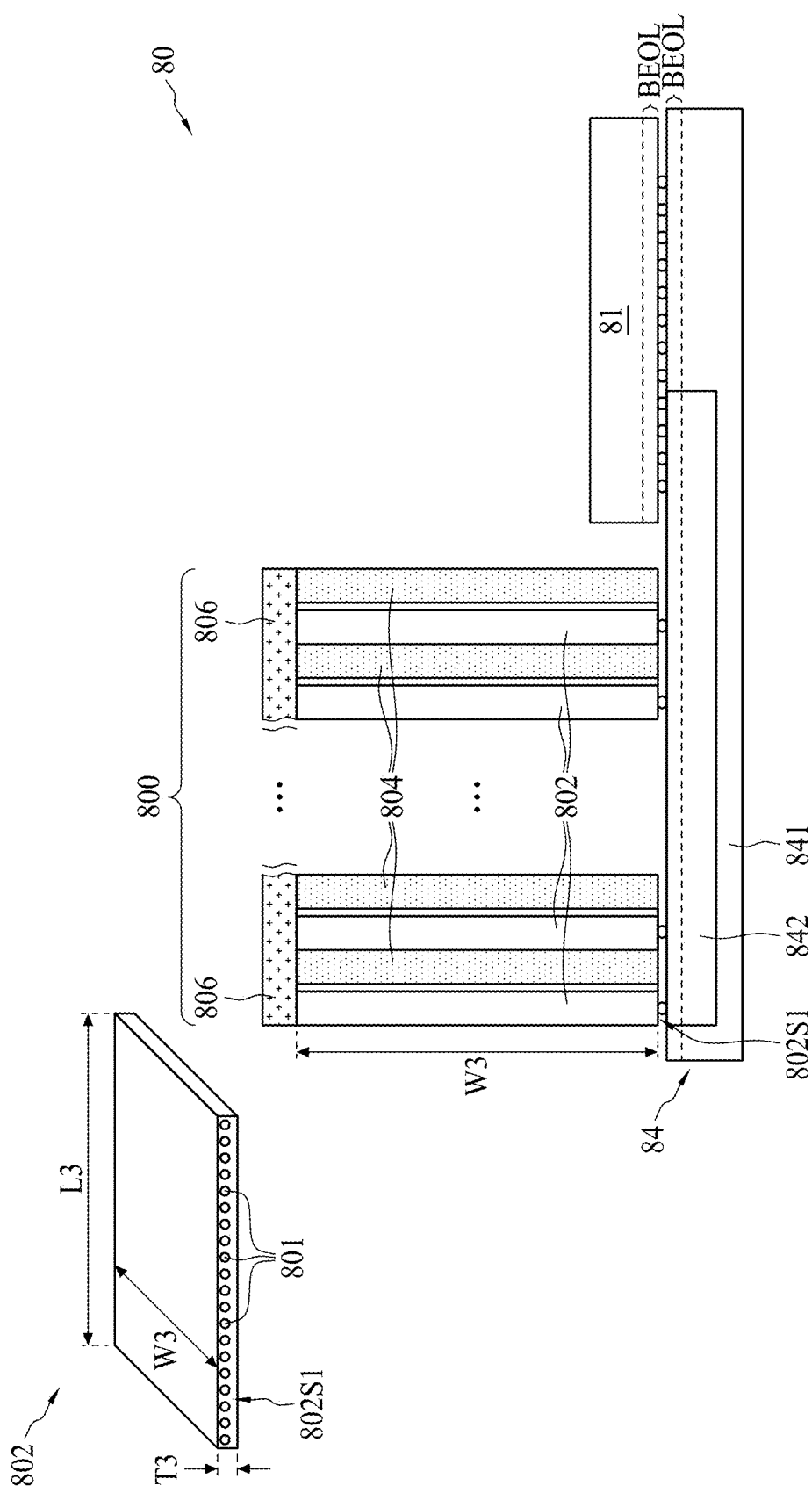
FIGS. 8(a) and 8(b) show another IC structure with NuHBM shelf, according to some embodiments of the present disclosure.
Figure 8B:
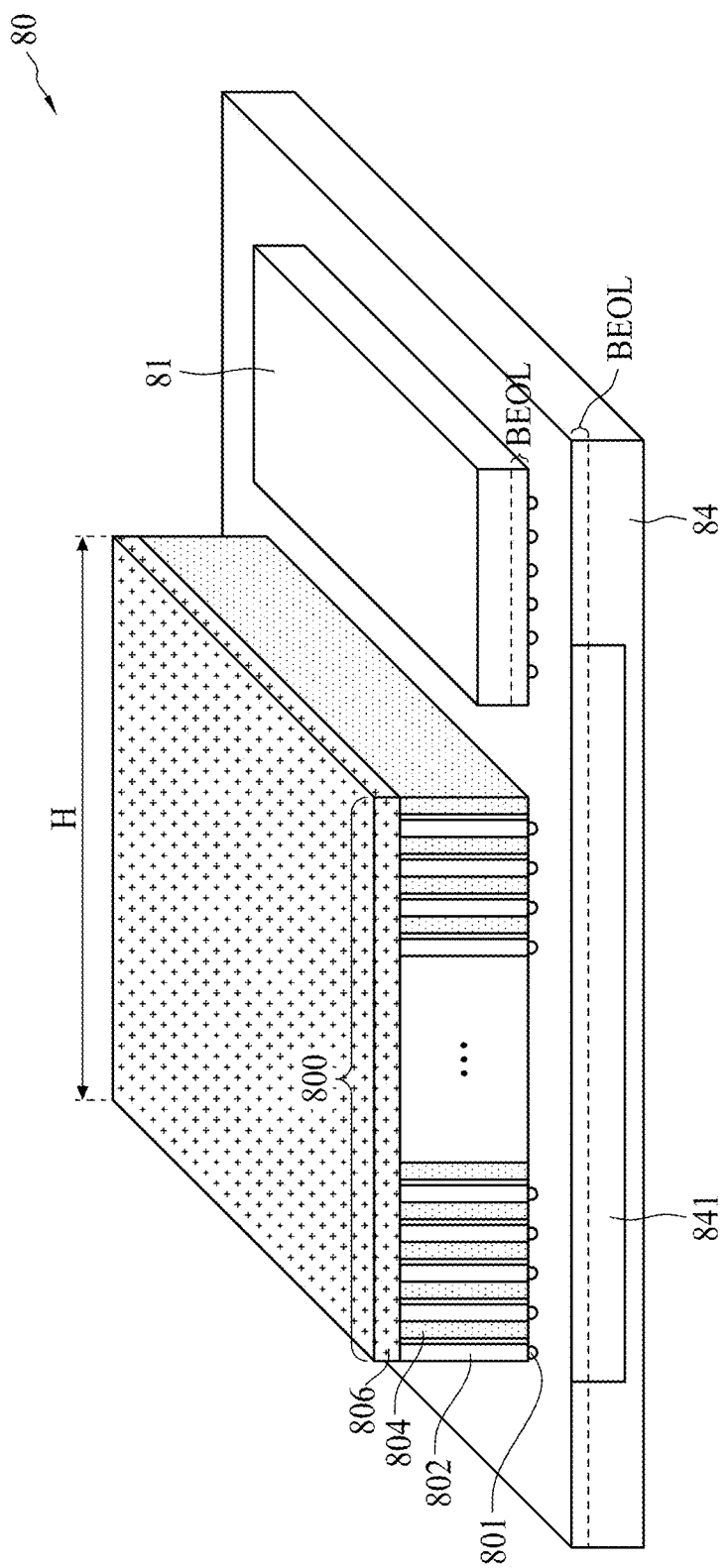

As shown in FIG. 8(a), the NuHBM system 800 and the logic die 81 are separately disposed on the packaging substrate 84. In some embodiments, the package substrate 84 includes a base portion 841, which is formed of a material similar to the package substrate 64 or 74, and an EMIB (Embedded Multi-die Interconnect Bridge) 842 embedded in the base portion 841, in which the EMIB 842 may be exposed from an upper surface of the base portion 841 of the package substrate 84 and used for electrical connection between the NuHBM system 800 and the logic die 81. Again, the logic die 81 is disposed over the packaging substrate 84 in a flip-chip manner, that is, the memory controller and the SOC or processor circuits are designed at the bottom surface (shown by a dash line with a label "BEOL") of the logic die 81. However, there is no TSV penetrating through the logic die 81. Of course, there could be a heat sink (not shown) over the logic die 81, such that the top surface the heat sink could be level with the top surface of the NuHBM system 800. Similarly, FIG. 8(a) and FIG. 8(b) of this embodiment are just sketched and exemplary drawings, the components in those drawings may not be proportional to their real sizes.

Although in this example the logic die 81 is facing downward (shown by a dash line with a label "BEOL" in FIG. 8(a)), in another example the logic 81 is facing upward. Since there could be TSVs and/or RDLs (not shown) in the logic die 81, the logic die 81 could be electrically connected to the package substrate 84 through these TSVs. Moreover, the signal and the power connections/transmissions in the present invention could be either based on the logic die 81, or based on the package substrate 84.

Figure 9A:
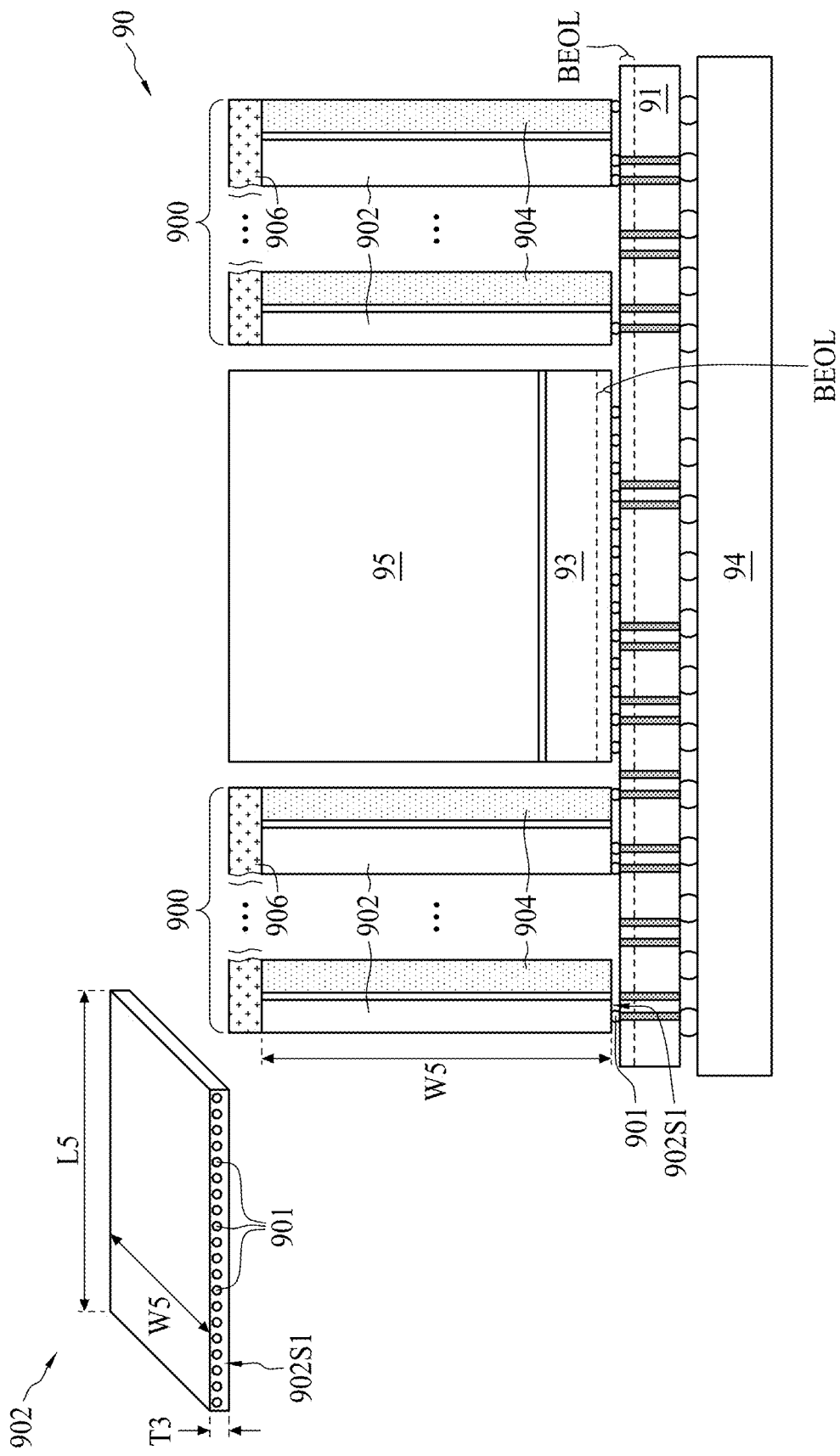
FIGS. 9(a) and 9(b) show another IC structure with multiple NuHBM shelfs, according to some embodiments of the present disclosure.
Figure 9B:
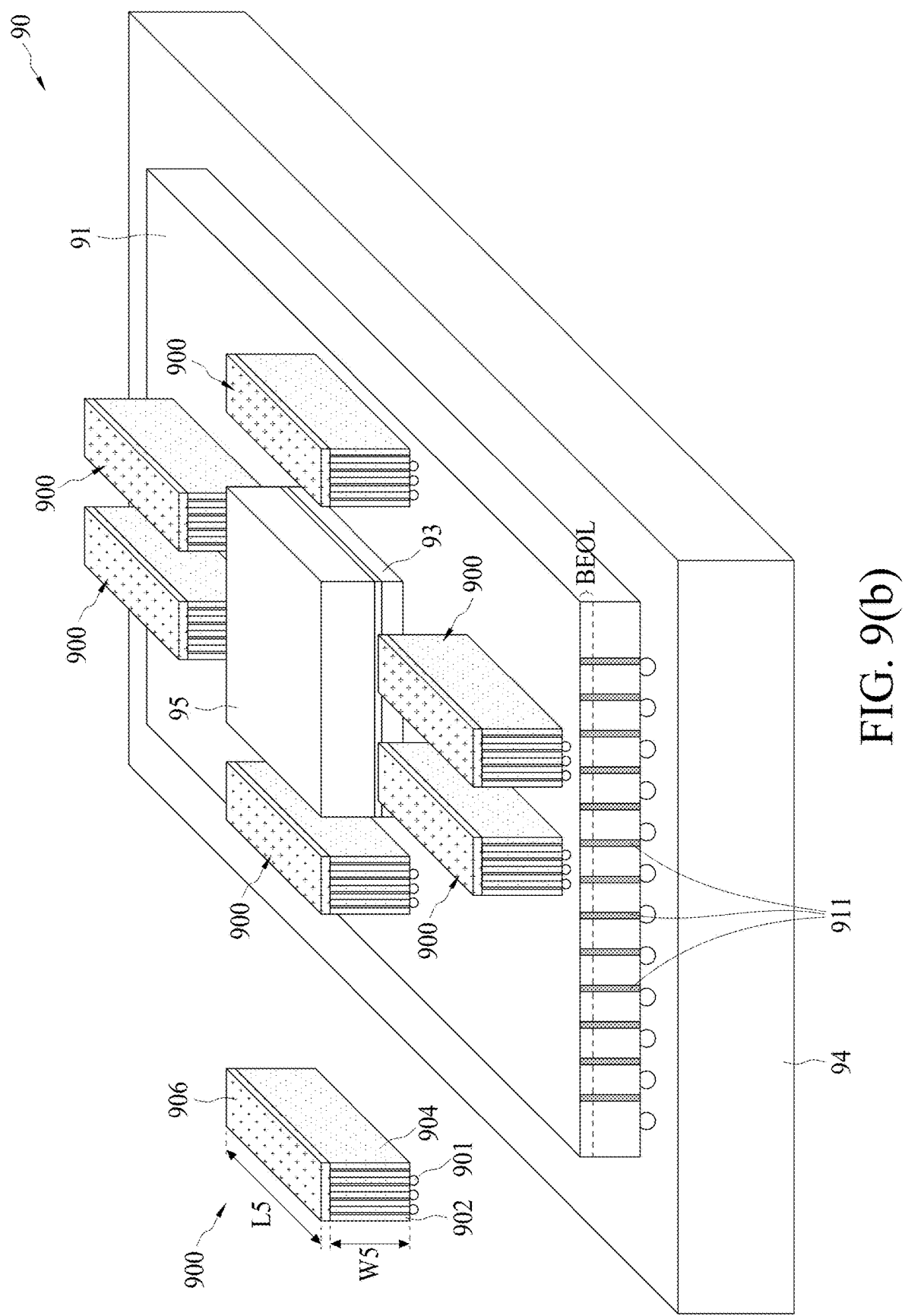

FIG. 9(a) shows another 3D IC structure 90 according to some embodiments of the present disclosure, and FIG. 9(b) is the stereoscopic view of the 3D IC structure 90. As shown in a right plot of FIG. 9(a), the 3D IC structure 90 includes a package substrate 94, a memory controller 91, a plurality of NuHBM systems or shelves 900 (each including a plurality of edge-pad semiconductor dies 902, a plurality of high thermal conductivity layers 904 and a top-high thermal conductivity layer 906), an SOC chip 93 and a heat sink 95. Each NuHBM system 900 is separately and electrically bonded to the package substrate 94. Each semiconductor die 902 may include edge pads 901 arranged along a sidewall 902S1 in the lengthwise direction (L5) of the HBM die 902. The SOC chip 93 is electrically connected to the package substrate 94 through the memory controller 91. The materials and configurations of the package substrate 94, the semiconductor dies 902, the high thermal conductivity layer 904, the top-high thermal conductivity layer 906, the memory controller 91, the SOC chip 93 and the heat sink 95 are similar to those of the package substrate 64, the semiconductor die 602, the high thermal conductivity layer 604, the top-high thermal conductivity layer 606, the SOC chip 63 and the heat sink 65, respectively, and details of these features are not repeated for brevity.

In some embodiments, twenty four (24) semiconductor dies 902 are split into 6 NuHBM systems 900, and each NuHBM system 900 comprises 4 semiconductor dies 902. Those NuHBM systems 900 are placed on the 4 sides of the SOC die 93 (26 mm×33 mm), as shown in FIG. 9(b). Two NuHBM systems 900 are disposed along a lengthwise side (with the length of 33 mm) of the SOC die 93, another two NuHBM systems 900 are disposed along an opposite lengthwise side (with the length of 33 mm) of the SOC die 93, one NuHBM system 900 is disposed along a widthwise side (with the width of 26 mm) of the SOC die 93, and another one NuHBM system 900 is disposed along an opposite widthwise side (with the width of 26 mm) of the SOC die 93. Similarly, FIG. 9(a) and FIG. 9(b) of this embodiment are just sketched and exemplary drawings, the components in those drawings may not be proportional to their real sizes.

In the event each semiconductor die 902 is an LPDDR5 DRAM chip with special dimensions of 6.25 mm width (W5)×10 mm length (L5), it may have 500 edge pads along the sidewall 902S1 of a length of 10 mm when the boning pitch is 20 μm. Suppose about one half of the edge pads are used for data I/O, each semiconductor die 902 could have a 256-bit data width. If four such 16 Gb LPDDR5 chips are horizontally stacked together as an NuHBM system 900, each NuHBM system 900 can have a 1024-bit data width and a bandwidth about 9830 Gb/s (1024×9.6 Gb/s). Since the 3D IC structure 90 includes 6 NuHBM systems 900, the total 6 NuHBM systems 900 can have a 6K-bit data width and a bandwidth about 58980 Gb/s (6×1024×9.6 Gb/s, wherein each I/O pad has a 9.6 Gb/s bandwidth).

In the event the bonding pitch is 10 μm, it may have 1000 edge pads along the sidewalls of the length of 10 mm. Suppose about one half of edge pads are used for data I/O, each HBM die 902 could have a 512-bit data width. If four such 16 Gb LPDDR5 chips are horizontally stacked together as an NuHBM system 900, each NuHBM system 900 can have a 2048-bit data width and a bandwidth about 19660 Gb/s (2048×9.6 Gb/s). Then the 3D IC structure 90 including 6 NuHBM systems 900 can have a 12K-bit data width and a bandwidth about 117964 Gb/s (6×2048×9.6 Gb/s). If each semiconductor die 902 in the NuHBM system 900 has a capacity of 32 Gb, then each 4-layer NuHBM system 900 can have a capacity of 32 Gb×4=128 Gb, and the total 6 NuHBM systems 900 can support the capacity of 128 Gb×6=768 Gb.

Of course, each NuHBM system 900 may have 6, 8, 10, or more semiconductor dies 902 in the present invention. For example, in FIG. 9(a) and FIG. 9(b), each NuHBM system 900 may have 10 semiconductor dies 902 and there are total 60 semiconductor dies 902. Again, if each semiconductor die 902 is an LPDDR5 DRAM chip with special dimensions of 6.25 mm width×10 mm length, it may have 500 edge pads (which may include a 256-bit data width) along the sidewall 902S1 of the length of 10 mm when the boning pitch is 20 μm. Each NuHBM system 900 can have a 2560-bit data width (256 bits×10) and a bandwidth about 24576 Gb/s (2560×9.6 Gb/s, wherein each I/O pad has a 9.6 Gb/s bandwidth). Since the 3D IC structure 90 includes 6 NuHBM systems 900, the total 6 NuHBM systems 900 can have a 15,360-bit data width and a bandwidth about 147456 Gb/s (6×2560×9.6 Gb/s). In the event the bonding pitch is 10 μm, it may have 1000 edge pads (which may include a 512-bit data width) along the sidewall with the length of 10 mm. Each NuHBM system 900 can have a 5120-bit data width (512 bits×10) and a bandwidth around 49152 Gb/s (5120×9.6 Gb/s). Then the 3D IC structure 90 including 6 NuHBM systems 900 can have a 12K-bit data width and a bandwidth about 294912 Gb/s (6×5120×9.6 Gb/s). If each semiconductor die 902 in the NuHBM system 900 has a 32 Gb capacity, then each 10-layer NuHBM system 900 can have a capacity of 32 Gb×10=320 Gb, and the total 6 NuHBM systems 900 can support a capacity of 320 Gb×6=1920 Gb.

The following table shows the comparison between several existing HBM systems (HBM3, HBM3E and HBM3E) and the proposed NuHBM systems (based on the LPDDR5 specification):

|  | HBM3 | HBM3E | HBM4 | Proposed HBM system with 4 dice (6 group = 24 dice) | Proposed HBM system with 10 dice (6 group = 60 dice) |
| --- | --- | --- | --- | --- | --- |
| layers | 12 | 12 | 16 | 4 (24) | 10 (60) |
| Max Capacity | 24 GB | 36 GB | 48 GB | 128 Gb** = 16 GB (768 Gb** = 96 GB) | 320 Gb** = 40 GB (1920 Gb** = 240 GB) |
| Data I/O | 1024 | 1024 | 2048 | 2048* (12288*) | 5120* (30720*) |
| I/O bandwidth | 6.4 Gb/s | 9.2 Gb/s | N/A | 9.6 Gb/s (LPDDR5) | 9.6 Gb/s (LPDDR5) |
| Total bandwidth | 819 GB/s | 1.2 TB/s | N/A (2.355 TB/s***) | 19660 Gb/s = 2457 GB/s = 2.457 TB/s (117964 Gb/s = 14745 GB/s = 14.745 TB/s) | 49152 Gb/s = 6144 GB/s = 6.144 TB/s (294912 Gb/s = 36864 GB/s = 36.864 TB/s) |

*bonding pitch = 10 μm
**Each HBM die = 32 Gb
***Each I/O bandwidth = 9.2 Gb/s

Under the above architecture to design a distributed NuHBM system 900 surrounding the 4 sides of the SOC chip 93, each semiconductor 902 is definitely achievable with today's DRAM design skills in compliance with the specification of LPDDR5 (also applicable to the JEDEC standard). Since these I/Os of the NuHBM system 900 are electrically connected by the advanced bonding technology such as micro-bumps or hybrid-bonding methods to the I/O's of the SOC die 93 which should use the advanced logic technology such as 3 nm or 5 nm, a high performance and low power SOC-DRAM (HBM) interface will be achieved. The power distribution system may be achieved by the vertical TSV/RDLs connections between the bottom portion of the NuHBM system 900 and the bottom portion of the SOC chip 93 in the memory controller 91 (see FIG. 9(a)), and thus a large and stable current flow system can be well established.

For the embodiment shown in FIGS. 9(a) and 9(b), 6 NuHBM systems 900 and the SOC die 93 are disposed over the memory controller 91 which is then disposed over the packaging substrate 94. The memory controller 91 includes multiple TSVs 911. Each NuHBM system 900 includes 4 or more layers of semiconductor dies 902 in a stacked structure along with the inventive thermal heat dissipation system and the edge I/O invention. In addition, the data latency on both row and column data read/write (R/W) performance should be achieved similarly like those of the LPDDR5 specification, as described in FIGS. 4(a) and 4(b), and the LPDDR5 latency specification should be achieved.

The above embodiment describes an example of the proposed inventive architecture of designing NuHBM systems to supply high-bandwidth/low-latency memory data to the SOC die. For example, if 24 semiconductor dies 902 are distributed to 8 NuHBM systems 900, then each NuHBM system 900 just includes 3 semiconductor dies 902.

Figure 10:
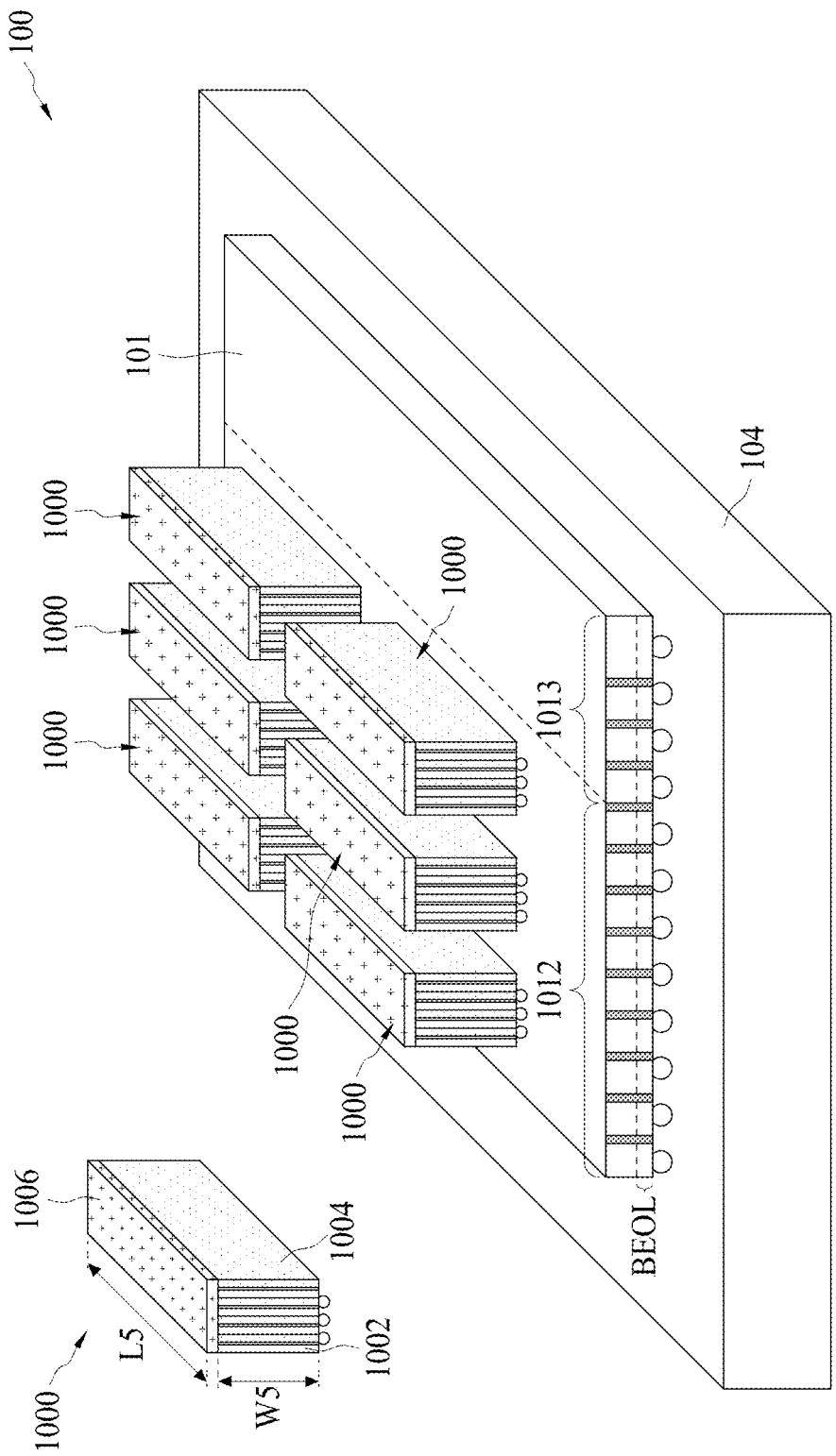
FIG. 10 shows another IC structure with multiple NuHBM shelfs, according to some embodiments of the present disclosure.

FIG. 10 shows another 3D IC structure 100 of the present disclosure. The 3D IC structure 100 includes a package substrate 104, a logic die 101 with memory controller 1012 and SOC or processor circuit 1013, a plurality of NuHBM systems 1000 (each including a plurality of edge-pad semiconductor dies 1002, optionally a plurality of high thermal conductivity layers 1004 and optionally a top-high thermal conductivity layer 1006). Each NuHBM system 1000 is electrically connected to the package substrate 104 through the logic die 91. The materials and configurations of the package substrate 104, the semiconductor die 1002, the high thermal conductivity layer 1004, the top-high thermal conductivity layer 1006, and the logic die 101 are similar to those of the package substrate 74, the semiconductor die 702, the high thermal conductivity layer 704, the top-high thermal conductivity layer 706 and the logic die 71, respectively, and details of these features are not repeated for brevity.

Similar to FIG. 9(b), the 3D IC structure 100 in FIG. 10 may include 24 edge-pad semiconductor dies 1002 split into 6 NuHBM systems 1000 and each NuHBM system 1000 comprises 4 semiconductor dies 1002. However, unlike FIG. 9(b), the SOC circuit 1013 of this embodiment is combined with the memory controller 1012 into the logic die 101, and the 6 NuHBM systems 1000 are stacked over the logic die 101 with memory controller 1012 and SOC or processor circuit 1013. Those 6 NuHBM systems 1000 could be bonded close to the memory controller 1012, as shown in FIG. 10. Similarly, FIG. 10 of this embodiment are just sketched and exemplary drawings, the components in those drawings may not be proportional to their real sizes.

The present invention provides a 3D IC structure with at least one NuHBM system which includes a plurality of edge-pad semiconductor dies horizontally stacked together. Unlike existing HBM structures, edge pads of each semiconductor die are over the side face(s) of semiconductor die for interconnection to allow for skip-die signal and power distribution without going through other semiconductor dies. There is no TSVs in each semiconductor die as compared with an existing DRAM chip used in HBM; therefore, it is unnecessary to perform die thinning. Moreover, the high thermal conductivity material is disposed between two adjacent semiconductor dies and optionally coupled to another high thermal conductivity material covering other side faces of the semiconductor dies. Furthermore, as shown in the previous table, each NuHBM system could more easily offer the increased number of dice with a much higher data bandwidth (about 2.457 TB/s to about 6.144 TB/s) even based on more stringent requirements of the access latency (such as the LPDDR5 latency specification). Thus, the present invention can resolve the long-existing memory bandwidth bottleneck for data input and output from the Processor/SOC.

Furthermore, the expensive interposer is unnecessary in the 3D IC structure of the present invention. As shown in FIG. 1, in the CoWoS structure 20. the HBM structure 21 with the SOC chip 22 has all signal and power connections arranged in a flipped manner to be electrically connected to the substrate 24 through an interposer 23 with TSVs 201, which pitch is about 10 to 20 microns. However, the present invention could use memory controller and SOC circuit on a 3 nm/5 nm die, by simplifying CoWoS structure without a layer of wafer or an interposer, which is the most advanced version of integrating HBM systems on a die, in which the die serves both functions of being a memory controller and an SOC chip on the same level of silicon layer. The silicon layer has a flipped surface directly facing the substrate. Thus, the proposed new structure can be referred to as Integrated Memory System on SoC wafer on Substrate (IMSWonS).

The following summarizes advantages of the NuHBM system with Vertical Shelf Architecture (VSA) in contrast to the HBM specification:

(1) An HBM 4.0 die occupies a footprint area like that of an LPDDR5 HBM die with a capacity of 16 Gb (e.g. 6.25 mm×7.59 mm). However, the footprint area of the NuHBM system depends on how many units of the edge-pad semiconductor dies plus high thermal conductivity layer next to the edge-pad semiconductor die are used, for example, 24 edge-pad semiconductor dies occupy about 4.8 mm (see FIG. 7(b)) which is much smaller than the area occupied by an HBM 4.0 structure.

(2) The I/Os of the NuHBM system comes directly from each single edge-pad semiconductor die without mixing with those of other edge-pad semiconductor dies. As such, the signal can be better managed (such as less skew) than the signal coming out from 16-die stack used in the HBM4.0 framework.

(3) The capacity of NuHBM system is scalable and adaptive without worrying about the signal transmission through other DRAM dies. The capacity of NuHBM system could be extremely high, or middle-size down to lower capacity, because each semiconductor die used in the present NuHBM system has its own identity or stand-alone edge-pads, but not limited by the TSVs used in today's HBM DRAM stack.

(4) The total data bandwidth can be achieved by increasing the total number of I/Os (equal to a product of "the number I/Os from each edge-pad semiconductor die" multiplied by "the number of edge-pad semiconductor die") by using more edge-pad semiconductor dies on the shelf structure, in contrast to 1K or 2K I/Os made in the stacked dice of the HBL4.0 framework. Thus, besides driving harshly on the data rate from each I/O, the total bandwidth can be achieved by using more dice for delivering more data I/Os.

(5) Since signals are coming out from each edge-pad semiconductor die and are directly connected to the I/Os of the memory controller and later immediately operated in and out from the SOC die, the signal integrity can be significantly improved. The power for handling the I/Os can also be reduced.

What is claimed is:

1. An IC structure comprising:
a first memory stack comprising:
a plurality of semiconductor dies horizontally separate from each other, wherein each semiconductor die comprises a top surface, a bottom surface opposite to the top surface, and four sidewalls comprising a first sidewall, a second sidewall, a third sidewall and a fourth sidewall, and a plurality of edge pads arranged along the first sidewall; wherein the area of the bottom surface or the top surface of each semiconductor die is larger than that of any sidewall; and
a logic die with memory controller under the first memory stack and electrically connected to the plurality of edge pads of each semiconductor die;
a logic die with processor circuit disposed over and electrically connected to the logic die with memory controller; and
a packaging substrate under and electrically connected to the logic die with memory controller,
wherein a die area of the logic die with memory controller is larger than the sum of a horizontal cross-section area of the first memory stack and a die area of the logic die with processor circuit,
wherein there is no interposer between the packaging substrate and the logic die with memory controller, and there is no TSV in any semiconductor die of the first memory stack.

2. The IC structure of claim 1, further comprising:
an upward extending thermal conductivity layer between two adjacent semiconductor dies; wherein the thermal conductivity of the upward extending thermal conductivity layer is higher than that of Si or $SiO_2$; and/or
a laterally extending thermal conductivity layer covering each second sidewall of the plurality of semiconductor dies and thermally coupled to the upward extending thermal conductivity layer, wherein the laterally extending thermal conductivity layer is opposite to the first sidewalls of the plurality of semiconductor dies, and the thermal conductivity of the laterally extending thermal conductivity layer is higher than that of Si or $SiO_2$.

3. The IC structure of claim 2, wherein the upward extending thermal conductivity layer or the laterally extending thermal conductivity layer comprises undoped polysilicon, large crystalline silicon, SiC, BN, AlN, W, or copper.

4. The IC structure of claim 1, wherein each semiconductor die comprises a DRAM die, and the plurality of edge pads of each DRAM die includes about 128 to 5000 edge pads, and a pitch between two adjacent edge pads is between about 5 μm and about 100 μm.

5. The IC structure of claim 4, wherein the plurality of edge pads of each semiconductor die includes a subset of data pads, and the logic die with memory controller selects a predetermined data width from the subset of data pads of one semiconductor die, or a portion of the plurality of semiconductor dies, or all the plurality of semiconductor dies.

6. The IC structure of claim 5, wherein the predetermined data width selected by the logic die with memory controller is set by a mode register in each semiconductor die.

7. The IC structure of claim 5, wherein the logic die with memory controller selects the predetermined data width from the subset of data pads of a portion or all of the plurality of semiconductor dies.

8. The IC structure of claim 5, wherein:
the logic die with memory controller selects the predetermined data width from the subset of data pads of one, a portion or all of the plurality of semiconductor dies by a plurality of SRAM arrays each corresponding to one of the plurality of semiconductor dies,
wherein each SRAM array temporarily holds the predetermined data width from the corresponding semiconductor die.

9. The IC structure of claim 4, wherein the logic die with memory controller includes multiple TSVs.

10. The IC structure of claim 1, further comprising a heat sink over the logic die with processor circuit, and a top surface of the heat sink is level with that of the first memory stack.

11. The IC structure of claim 1, further comprising:
a second memory stack comprising:
a plurality of semiconductor dies horizontally separate from each other, wherein each semiconductor die comprises a top surface, a bottom surface opposite to the top surface, and four sidewalls comprising a first sidewall, a second sidewall, a third sidewall and a fourth sidewall, and a plurality of edge pads arranged along the first sidewall; wherein the area of the bottom surface or the top surface of each semiconductor die of the second memory stack is larger than that of any sidewall; and
an upward extending thermal conductivity layer between two adjacent semiconductor dies; wherein the thermal conductivity of the upward extending thermal conductivity layer is higher than that of Si or SiO2,
wherein the first memory stack and the second memory stack are horizontally spaced apart from the logic die with processor circuit, and are disposed along one side of the logic die with processor circuit.

12. The IC structure of claim 1, further comprising:
a second memory stack, a third memory stack, and a fourth memory stack, each of them comprising:
a plurality of semiconductor dies horizontally separate from each other, wherein each semiconductor die comprises a top surface, a bottom surface opposite to the top surface, and four sidewalls comprising a first sidewall, a second sidewall, a third sidewall and a fourth sidewall, and a plurality of edge pads arranged along the first sidewall; wherein the area of the bottom surface or the top surface is larger than that of any sidewall; and
an upward extending thermal conductivity layer between two adjacent semiconductor dies; wherein the thermal conductivity of the upward extending thermal conductivity layer is higher than that of Si or SiO2,
wherein the first memory stack, the second memory stack, the third memory stack and the fourth memory stack are horizontally spaced apart from the logic die with processor circuit, and are disposed along four adjacent to respective sides of the logic die with processor circuit, respectively.

13. The IC structure of claim 1, wherein each edge pad of each semiconductor die includes an edge contact in a back-end-of-line (BEOL) region and a conductive via over the edge contact and in a dielectric layer at the top surface, wherein the area of the conductive via is greater than that of the edge contact.

14. The IC structure of claim 1, wherein each edge pad of each semiconductor die includes an edge contact in a back-end-of-line (BEOL) region and a conductive via over the edge contact and in a redistribution layer (RDL) at the top surface, wherein the area of the conductive via is greater than that of the edge contact.

15. The IC structure of claim 14, wherein the edge contact electrically connects to a signal pad in a back-end-of-line (BEOL) region of the semiconductor die surrounded by a seal ring structure.

16. The IC structure of claim 1, wherein each edge pad of each semiconductor die includes a conductive line in a redistribution layer (RDL), the conductive line electrically connected to a signal pad in a back-end-of-line (BEOL) region of the semiconductor die surrounded by a seal ring structure.

17. The IC structure of claim 16, wherein the RDL includes a plurality of stacked dielectric layers within which the conductive line is located.

18. The IC structure of claim 17, wherein a portion of the conductive line is disposed in a scribe line region of a semiconductor wafer prior to dicing of the semiconductor wafer.

* * * * *